(12) United States Patent
Kwon et al.

(10) Patent No.: US 10,559,645 B2
(45) Date of Patent: Feb. 11, 2020

(54) ORGANIC LIGHT-EMITTING DIODE DISPLAY

(71) Applicant: Samsung Display Co., Ltd., Yongin-si, Gyeonggi-do (KR)

(72) Inventors: Sun-Ja Kwon, Gunpo-si (KR); Jae-Yong Lee, Yongin-si (KR); Ji-Eun Lee, Seoul (KR); So-Young Kang, Gwangju (KR); Sang-Ho Seo, Cheonan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 15/461,387

(22) Filed: Mar. 16, 2017

(65) Prior Publication Data

US 2017/0186835 A1    Jun. 29, 2017

Related U.S. Application Data

(63) Continuation of application No. 14/869,591, filed on Sep. 29, 2015, now Pat. No. 9,627,465.

(30) Foreign Application Priority Data

Feb. 28, 2015 (KR) .......................... 10-2015-0028724

(51) Int. Cl.
*H01L 27/32* (2006.01)
*H01L 27/12* (2006.01)

(52) U.S. Cl.
CPC ........ *H01L 27/3276* (2013.01); *H01L 27/124* (2013.01); *H01L 27/1225* (2013.01); *H01L 27/1255* (2013.01); *H01L 27/3258* (2013.01)

(58) Field of Classification Search
CPC ...................................................... H01L 27/32
(Continued)

(56) References Cited

U.S. PATENT DOCUMENTS 4,623,908 A * 11/1986 Oshima ................. G02F 1/1368
                                                   257/66
5,912,474 A *  6/1999 Yamazaki ............... H01L 27/12
                                                   257/350

(Continued)

FOREIGN PATENT DOCUMENTS

KR    10-2005-0052033 A    6/2000
KR    10-2006-0128271 A    12/2006
(Continued)

*Primary Examiner* — Sheng-Bai Zhu
(74) *Attorney, Agent, or Firm* — Lewis Roca Rothgerber Christie LLP

(57) ABSTRACT

An organic light-emitting diode (OLED) display is disclosed. In one aspect, the display includes a substrate and an active pattern formed over the substrate and including first to fourth regions. A gate insulation layer is formed over the active pattern and the substrate, and a first gate electrode is formed over the gate insulation layer and partially overlapping the active pattern. The first gate electrode, the first region and the second region define a first transistor. A second gate electrode is formed on the same layer as the first gate electrode. The second gate electrode, the third region and the fourth region define a second transistor, and the second gate electrode, the second region and the fourth region define a third transistor. A first insulating interlayer is formed over the first gate electrode, the second gate electrode, and the gate insulation layer.

34 Claims, 13 Drawing Sheets

(58) Field of Classification Search
USPC .................. 257/66, 72; 438/155, 163, 157
See application file for complete search history.

(56) References Cited

U.S. PATENT DOCUMENTS

| | | | |
|---|---|---|---|
| 6,589,826 B2 * | 7/2003 | Park | H01L 27/12 |
| | | | 438/155 |
| 6,593,592 B1 * | 7/2003 | Yamazaki | H01L 27/1237 |
| | | | 257/59 |
| 7,112,476 B2 | 9/2006 | Kim et al. | |
| 7,745,829 B2 | 6/2010 | Yamazaki et al. | |
| 9,627,465 B2 * | 4/2017 | Kwon | H01L 27/32 |
| 2004/0251844 A1 * | 12/2004 | Hashido | G09G 3/325 |
| | | | 315/169.3 |
| 2005/0212787 A1 * | 9/2005 | Noguchi | G09G 3/3233 |
| | | | 345/204 |
| 2008/0121889 A1 * | 5/2008 | Ishiguro | H01L 29/42384 |
| | | | 257/66 |
| 2010/0231615 A1 * | 9/2010 | Tokuda | G09G 3/3233 |
| | | | 345/690 |
| 2015/0137099 A1 | 5/2015 | Choi | |

FOREIGN PATENT DOCUMENTS

| | | |
|---|---|---|
| KR | 10-2009-0110485 A | 10/2009 |
| KR | 10-1401452 B1 | 5/2014 |
| KR | 10-2016-0090949 A | 8/2016 |
| KR | 10-2016-0098650 A | 8/2016 |

* cited by examiner

SECOND
DIRECTION

FIRST
DIRECTION

ORGANIC LIGHT-EMITTING DIODE DISPLAY

INCORPORATION BY REFERENCE TO ANY PRIORITY APPLICATIONS

This application is a continuation of U.S. patent application Ser. No. 14/869,591, filed Sep. 29, 2015, which claims priority under 35 USC § 119 to Korean Patent Applications No. 10-2015-0028724, filed on Feb. 28, 2015 in the Korean Intellectual Property Office (KIPO), the disclosures of which are incorporated by reference herein in their entireties.

BACKGROUND

Field

The described technology generally relates to an organic light-emitting diode display.

Description of the Related Technology

A display device generates an image using a matrix of pixels emitting light. An organic light-emitting diode (OLED) display emits light that has a wavelength that depends on the organic material of the OLED. For example, the OLED can include organic material corresponding to one of a red color light, a green color light, and a blue color light.

The OLED display can be driven with an analog or a digital driving method. While the analog driving method produces grayscale using variable voltage levels corresponding to input data, the digital driving method produces grayscale using variable time duration in which the OLED emits light. In the analog driving method, as a voltage level of a data line changes, crosstalk can occur in lines that are adjacent to the data line.

SUMMARY OF CERTAIN INVENTIVE ASPECTS

One inventive aspect relates to an OLED display having improved definition.

Another aspect is an OLED display that includes a substrate, an active pattern, a gate insulation layer, a first gate electrode, a second gate electrode, a first insulating interlayer, a first conductive pattern, a first power supply voltage line, a first electrode, an organic light emitting layer, and a second electrode. The active pattern is formed on the substrate, and includes a first region, a second region, a third region, and a fourth region. The gate insulation layer is formed on the active pattern and the substrate. The first gate electrode is formed on the gate insulation layer, and partially overlaps the active pattern. The first gate electrode defines a first transistor together with the first region and the second region. The second gate electrode is formed at the same level with the first gate electrode, and defines a second transistor together with the third region and the fourth region. The second gate electrode defines a third transistor together with the second region and the fourth region. The first insulating interlayer is formed on the first gate electrode, the second gate electrode, and the gate insulation layer. The first conductive pattern is formed on the first insulating interlayer, and overlaps at least a portion the third and fourth regions. The first conductive pattern defines a parasitic capacitor together with the at least a portion the third and fourth regions with which the first conductive pattern is overlapped. The first power supply voltage line is formed on the first conductive pattern, and receives a first power supply voltage. The first electrode is formed on the first power supply voltage line, and is electrically connected to the first through third transistors. The organic light emitting layer is formed on the first electrode. The second electrode is formed on the organic light emitting layer.

In example embodiments, the second gate electrode includes a second gate extended portion and a second gate protruding portion. The second gate extended portion can extend in a first direction that is in paralleled to an upper surface of the substrate. The second gate protruding portion can be protruded from the second gate extended portion in a second direction that is perpendicular to the first direction.

In example embodiments, a first portion of the second gate extended portion serves as a gate electrode of the third transistor, and the second gate protruding portion serves as a gate electrode of the second transistor.

In example embodiments, the active pattern further includes a fifth region. The second gate electrode can define a fourth transistor together with the first region and the fifth region. The second portion that is opposite to the first portion of the second gate extended portion can serve as a gate electrode of the fourth transistor.

In example embodiments, the OLED display further includes a data line. The data line can be formed at the same level with the first power supply voltage line, and can receive a data signal. The data line can provide the data signal to the fifth region via a first contact hole. The first conductive pattern can be interposed between the data line and the third and fourth regions of the active pattern such that the first conductive pattern shields a parasitic capacitor between the data line and the third and fourth regions of the active pattern.

In example embodiments, the OLED display further includes a second conductive pattern. The second conductive pattern can be formed at the same level with the first conductive pattern, and can partially overlap the first gate electrode and the first and second regions of the active pattern. The second conductive pattern can have an opening that exposes at least a portion the first gate electrode, and can define a storage capacitor together with the first gate electrode.

In example embodiments, the first and second conductive patterns do not overlap with the second gate electrode.

In example embodiments, the second conductive pattern and the first conductive pattern are simultaneously formed using the same materials.

In example embodiments, the active pattern further includes a sixth region, a seventh region, an eighth region, a ninth region, and a tenth region.

In example embodiments, the OLED display further includes a third gate electrode and a fourth gate electrode. The third gate electrode can be formed on the gate insulation layer, and can define a fifth transistor together with the third region and the sixth region. The third gate electrode can define a sixth transistor together with the sixth region and the seventh region, and can define a seventh transistor together with the seventh region and the eighth region. The fourth gate electrode can be formed at the same level with the third gate electrode, and can define an eighth transistor together with the second region and the ninth region. The fourth gate electrode can define a ninth transistor together with the first region and the tenth region.

In example embodiments, the OLED display further includes a second power supply voltage line. The second power supply voltage line can be formed at the same level with the first and second conductive patterns, and can receive a second power supply voltage.

In example embodiments, the second power supply voltage line includes a second power supply extended portion and a second power supply protruding portion. The second power supply extended portion can extend in a first direction that is in paralleled to an upper surface of the substrate. The second power supply protruding portion can be protruded from the second power supply extended portion in a second direction that is perpendicular to the first direction.

In example embodiments, the second power supply protruding portion overlaps a portion of the third gate electrode.

In example embodiments, the OLED display further includes a first connection pattern and a second connection pattern. The first connection pattern can be electrically connected to the second power supply protruding portion and the seventh region via a second contact hole and a third contact hole. The second connection pattern can be electrically connected to the third region and the first gate electrode via a fourth contact hole and a fifth contact hole.

In example embodiments, the first power supply voltage line can provide the first power supply voltage to the tenth region via a six contact hole, and can provide the first power supply voltage to the second conductive pattern via a seventh contact hole. The first power supply voltage line can provide the first power supply voltage to the first conductive pattern via an eighth contact hole.

In example embodiments, the OLED display can further include a third connection pattern. The third connection pattern can be electrically connected to the ninth region and the first electrode via a ninth contact hole.

In example embodiments, the OLED display can further include a second insulating interlayer and a third insulating interlayer. The second insulating interlayer can be formed on the first conductive pattern and the first insulating interlayer. The third insulating interlayer can be formed on the first power supply voltage line and the second insulating interlayer.

In example embodiments, the second gate electrode can receive a scan signal. The third gate electrode can receive an initialization signal. The fourth gate electrode can receive a light emitting signal.

In example embodiments, the OLED display can further include a first connection pattern. The first connection pattern can be electrically connected to the first conductive pattern and the seventh region via a second contact hole and a third contact hole. The first conductive pattern can receive a second power supply voltage.

In example embodiments, the first power supply voltage line can provide the first power supply voltage to the tenth region via a sixth contact hole, and can provide the first power supply voltage to the second conductive pattern via a seventh contact hole.

Another aspect is an organic light-emitting diode (OLED) display, comprising: a substrate; an active pattern formed over the substrate and including a first region, a second region, a third region, and a fourth region; a gate insulation layer formed over the active pattern and the substrate; a first gate electrode formed over the gate insulation layer and partially overlapping the active pattern, wherein the first gate electrode, the first region and the second region define a first transistor; a second gate electrode formed on the same layer as the first gate electrode, wherein the second gate electrode, the third region and the fourth region define a second transistor, and wherein the second gate electrode, the second region and the fourth region define a third transistor; a first insulating interlayer formed over the first gate electrode, the second gate electrode, and the gate insulation layer; a first conductive pattern formed over the first insulating interlayer and overlapping at least a portion of the third and fourth regions, wherein the first conductive pattern and the overlapping portions of the third and fourth regions define a parasitic capacitor; a first power supply voltage line formed over the first conductive pattern and configured to receive a first power supply voltage; a first light-emitting electrode formed over the first power supply voltage line and electrically connected to the first to third transistors; an organic light-emitting layer formed over the first light-emitting electrode; and a second light-emitting electrode formed over the organic light-emitting layer.

In the above OLED display, the second gate electrode includes: a second gate extended portion extending in a first direction that is parallel to an upper surface of the substrate; and a second gate protruding portion protruding from the second gate extended portion in a second direction crossing the first direction.

In the above OLED display, the second gate extended portion includes a first portion formed on a first side of the second gate extended portion, wherein the first portion of the second gate extended portion includes a gate electrode of the third transistor, and wherein the second gate protruding portion includes a gate electrode of the second transistor.

In the above OLED display, the active pattern further includes a fifth region, wherein the second gate electrode, the first region and the fifth region define a fourth transistor, wherein the second gate extended portion includes a second portion formed on a second side opposing the first side of the second gate extended portion, and wherein the second portion of the second gate extended portion includes a gate electrode of the fourth transistor.

The above OLED display further comprises: a data line formed on the same layer as the first power supply voltage line, wherein the data line is configured to receive a data signal and provide the data signal to the fifth region via a first contact hole, and wherein the first conductive pattern is interposed between the data line and the third and fourth regions of the active pattern such that the parasitic capacitor is electrically disconnected from the data line.

The above OLED display further comprises: a second conductive pattern formed on the same layer as the first conductive pattern and partially overlapping the first gate electrode and the first and second regions of the active pattern, wherein the second conductive pattern has an opening that exposes at least a portion of the first gate electrode, and wherein the second conductive pattern and the first gate electrode define a storage capacitor.

In the above OLED display, the first and second conductive patterns do not overlap the second gate electrode.

In the above OLED display, the first and second conductive patterns are formed of the same material.

In the above OLED display, the active pattern further includes a sixth region, a seventh region, an eighth region, a ninth region, and a tenth region.

The above OLED display further comprises: a third gate electrode formed over the gate insulation layer, wherein the third gate electrode, the third region and the sixth region define a fifth transistor, wherein the third gate electrode, the sixth region and the seventh region define a sixth transistor, and wherein the third gate electrode, the seventh region and the eighth region define a seventh transistor; and a fourth gate electrode formed on the same layer as the third gate electrode, wherein the fourth gate electrode, the second region and the ninth region define an eighth transistor, and wherein the fourth gate electrode, the first region and the tenth region define a ninth transistor.

The above OLED display further comprises: a second power supply voltage line formed on the same layer as the first and second conductive patterns, wherein the second power supply voltage line is configured to receive a second power supply voltage.

In the above OLED display, the second power supply voltage line includes: a second power supply extended portion extending in a first direction that is parallel to an upper surface of the substrate; and a second power supply protruding portion protruding from the second power supply extended portion in a second direction crossing the first direction.

In the above OLED display, the second power supply protruding portion overlaps a portion of the third gate electrode.

The above OLED display further comprises: a first connection pattern electrically connected to the second power supply protruding portion and the seventh region via a second contact hole and a third contact hole, respectively; and a second connection pattern electrically connected to the third region and the first gate electrode via a fourth contact hole and a fifth contact hole, respectively.

In the above OLED display, the first power supply voltage line is configured to i) provide the first power supply voltage to the tenth region via a six contact hole and ii) provide the first power supply voltage to the second conductive pattern via a seventh contact hole, wherein the first power supply voltage line is configured to provide the first power supply voltage to the first conductive pattern via an eighth contact hole.

The above OLED display further comprises a third connection pattern electrically connected to the ninth region and the first electrode via a ninth contact hole.

The above OLED display further comprises: a second insulating interlayer formed over the first conductive pattern and the first insulating interlayer; and a third insulating interlayer formed over the first power supply voltage line and the second insulating interlayer.

In the above OLED display, the second gate electrode is configured to receive a scan signal, wherein the third gate electrode is configured to receive an initialization signal, wherein the fourth gate electrode is configured to receive a light emitting signal.

The above OLED display further comprises: a first connection pattern electrically connected to the first conductive pattern and the seventh region via a second contact hole and a third contact hole, respectively, wherein the first conductive pattern is configured to receive a second power supply voltage.

In the above OLED display, the first power supply voltage line is configured to i) provide the first power supply voltage to the tenth region via a sixth contact hole and ii) provide the first power supply voltage to the second conductive pattern via a seventh contact hole.

According to at least one of the disclosed embodiments, an OLED display includes a parasitic capacitor including a conductive pattern applied to a power supply voltage, a crosstalk that occurs between lines that is adjacent to a data signal line according to a voltage fluctuation of the data signal can be reduced. Accordingly, definition of the OLED display can be improved.

DETAILED DESCRIPTION OF CERTAIN INVENTIVE EMBODIMENTS

Hereinafter, embodiments of the described technology will be explained in detail with reference to the accompanying drawings. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1:
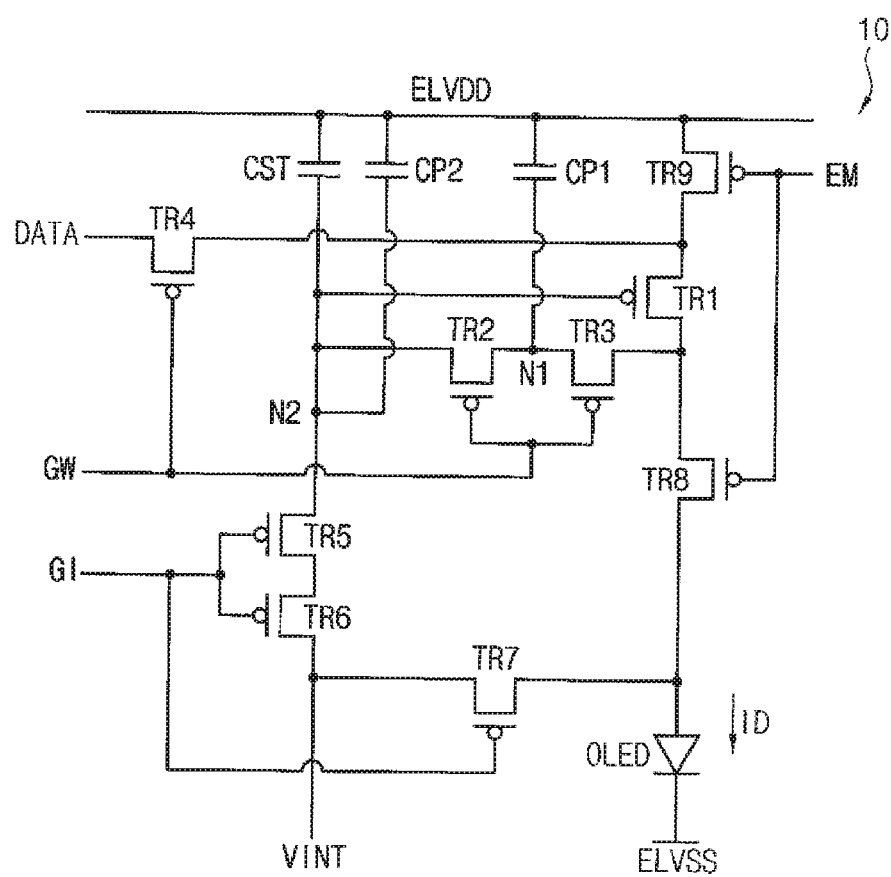
FIG. 1 is a circuit diagram illustrating a pixel in accordance with example embodiments.

FIG. 1 is a circuit diagram illustrating a pixel in accordance with example embodiments.

Referring to FIG. 1, a pixel 10 includes an organic light-emitting diode (OLED), a first transistor TR1, a second transistor TR2, a third transistor TR3, a fourth transistor TR4, a fifth transistor TR5, a sixth transistor TR6, a seventh transistor TR7, an eighth transistor TR8, a ninth transistor TR9, a storage capacitor CST, a parasitic capacitor CP1 and a parasitic capacitor CP2. A parasitic capacitor is capacitance that may exist between different portions of electronic components or a circuit due to their proximity to each other. For example, two conductors separated by an insulator (e.g., wires) can have a parasitic capacitor that is unintentionally or undesirably formed which can negatively affect the performance of the electronic component or circuit.

The OLED can emit light based on a driving current ID. The OLED can include a first terminal and a second terminal. In example embodiments, the second terminal of the OLED receives a third power voltage ELVSS. For example, the first terminal of the OLED is an anode, and the second terminal of the OLED is a cathode. Alternatively, the first terminal of the OLED can be a cathode, and the second terminal of the OLED can be an anode.

The first transistor TR1 can include a gate terminal, a first terminal, and a second terminal. In example embodiments, the first terminal is a source terminal, and the second terminal is a drain terminal. Alternatively, the first terminal can be a drain terminal, and the second terminal can be a source terminal.

The driving current ID can be generated by the first transistor TR1. In example embodiments, the first transistor TR1 operates in a saturation region. In this case, the first transistor TR1 can generate the driving current ID based on a voltage difference of the gate terminal and the source terminal, and a gradation can be implemented based on an amount of the driving current ID generated by the first transistor TR1. In some example embodiments, the first transistor TR1 operates in a linear region. In this case, a gradation can be implemented based on the amount of time during which the first transistor TR1 provides the driving current ID to the OLED within one frame.

The second transistor TR2 can include a gate terminal, a first terminal, and a second terminal, and the third transistor TR3 can include a gate terminal, a first terminal, and a second terminal. Here, the second transistor TR2 and the third transistor TR3 can be connected in series, and can serve as a dual gate transistor. For example, when the dual transistor is off (or turned off), leakage current is decreased. Thus, the second terminal of the second transistor TR2 can be connected to the first terminal of the third transistor TR3. Each of the gate terminals of the second and third transistors TR2 and TR3 can receive a scan signal GW. The first terminal of the second transistor TR2 can be connected to the gate terminal of the first transistor TR1. The second terminal of the third transistor TR3 can be connected to the second terminal of the first transistor TR1. In example embodiments, each of the first terminals of the second and third transistors TR2 and TR3 is a source terminal, and each of the second terminals of the second and third transistors TR2 and TR3 is a drain terminal. Alternatively, each of the first terminals of the second and third transistors TR2 and TR3 can be a drain terminal, and each of the second terminals of the second and third transistors TR2 and TR3 can be a source terminal.

The second transistor TR2 and the third transistor TR3 can connect the gate terminal of the first transistor TR1 to the second terminal of the first transistor TR1 while the scan signal GW is activated. In this case, the second transistor TR2 and the third transistor TR3 can operate in a linear region. That is, the second transistor TR2 and the third transistor TR3 can form a diode connection of the first transistor TR1 while the scan signal GW is activated. A voltage difference between the first terminal of the first transistor TR1 and the gate terminal of the first transistor TR1, the voltage difference of which amount corresponds to a threshold voltage of the first transistor TR1, can occur due to the diode connection. As a result, a sum voltage of the data signal DATA provided to the first terminal of the first transistor TR1 and the voltage difference (i.e., the threshold voltage) can be applied to the gate terminal of the first transistor TR1 while the scan signal GW is activated. Thus, the data signal DATA can be compensated as much as the threshold voltage of the first transistor TR1. The compensated data signal DATA can be applied to the gate terminal of the first transistor TR1. A uniformity of the driving current ID can be improved because of reducing an affect by the threshold voltage of the first transistor TR1.

A first node N1 is located between the second transistor TR2 and the third transistor TR3. In addition, a second node N2 is located in an output terminal of a second power supply voltage VINT (e.g., an initialization voltage). For example, an input terminal of an initialization voltage VINT is connected to a first terminal of the sixth transistor TR6 and a first terminal of the seventh transistor TR7, and the output terminal of an initialization voltage VINT is connected to a second terminal of the fifth transistor TR5 and a first terminal of the storage capacitor CST. In example embodiments, the pixel 10 may include the parasitic capacitor CP1 that includes the first node N1 and a first power supply voltage line ELVDD, and the parasitic capacitor CP2 that includes the second node N2 and the first power supply voltage line ELVDD. In this case, although a voltage level of the data signal DATA is changed, crosstalk that occurs in the first and second nodes N1 and N2 that are adjacent to a data signal line can be reduced. Accordingly, as the pixel 10 includes the first and second parasitic capacitors CP1 and CP2, a voltage fluctuation in the first and second nodes N1 and N2 can be decreased.

The fourth transistor TR4 can include a gate terminal, a first terminal, and a second terminal. The scan signal GW can be applied to the gate terminal. The first terminal can receive the data signal DATA. The second terminal can be connected to the first terminal of the first transistor TR1. In example embodiments, the first terminal of the fourth transistor TR4 is a source terminal, and the second terminal of the fourth transistor TR4 is a drain terminal. In some example embodiments, the first terminal of the fourth transistor TR4 is a drain terminal, and the second terminal of the fourth transistor TR4 is a source terminal.

The fourth transistor TR4 can provide the data signal DATA to the first terminal of the first transistor TR1 while the scan signal GW is activated. The fourth transistor TR4 can operate in a linear region.

The fifth transistor TR5 can include a gate terminal, a first terminal, and a second terminal, and the sixth transistor TR6 can include a gate terminal, a first terminal, and a second terminal. Here, the fifth transistor TR5 and the sixth transistor TR6 can be connected in series, and can serve as a dual gate transistor. For example, when the dual transistor is off (or turned off), leakage current is decreased. Thus, the second terminal of the fifth transistor TR5 can be connected to the first terminal of the sixth transistor TR6. Each of the gate terminals of the fifth and sixth transistors TR5 and TR6 can receive a data initialization signal GI. The initialization voltage VINT can be applied to the first terminal of the fifth transistor TR5. The second terminal of the sixth transistor TR6 can be connected to the gate terminal of the first transistor TR1. In example embodiments, each of the first terminals of the fifth and sixth transistors TR5 and TR6 is a source terminal, and each of the second terminals of the fifth and sixth transistors TR5 and TR6 is a drain terminal. Alternatively, each of the first terminals of the fifth and sixth transistors TR5 and TR6 can be a drain terminal, and each of the second terminals of the fifth and sixth transistors TR5 and TR6 can be a source terminal.

The fifth transistor TR5 and the sixth transistor TR6 can apply the initialization voltage VINT to the gate terminal of the first transistor TR1 while the data initialization signal GI is activated. In this case, the fifth transistor TR5 and the sixth transistor TR6 can operate in the linear region. Thus, the fifth transistor TR5 and the sixth transistor TR6 can initialize the gate terminal of the first transistor TR1 as the initialization voltage VINT while the data initialization signal GI is activated. In example embodiments, a voltage level of the initialization voltage VINT is sufficiently lower than a voltage level of the data signal DATA maintained by the storage capacitor CST in a previous frame. The initialization voltage VINT can be applied to the gate terminal of the first transistor TR1 that is a P-channel metal oxide semiconductor (PMOS) type transistor. In some example embodiments, a voltage level of the initialization voltage VINT is sufficiently higher than the voltage level of the data signal DATA maintained by the storage capacitor CST in a previous frame. The initialization voltage VINT can be applied to the gate terminal of the first transistor TR1 that is an N-channel metal oxide semiconductor (NMOS) type transistor.

In example embodiments, the data initialization signal GI is identical to the scan signal GW advanced by one horizontal time period. For example, the data initialization signal GI is applied to pixels located in the (n)th row of a plurality of pixels included in a display panel (where n is an integer of 2 or more) is substantially the same as the scan signal GW applied to pixels located in the (n−1)th row of a plurality of the pixels. Thus, the data initialization signal GI that is activated can be applied to pixels located in the (n)th row by applying the scan signal GW that is activated to pixels located in the (n−1)th row. As a result, the gate terminal of the first transistor TR1 included in pixels located in the (n)th row can be initialized as the initialization voltage VINT when the data signal DATA is applied to pixels located in the (n−1)th row.

The seventh transistor TR7 can include a gate terminal, a first terminal, and a second terminal. A diode initialization signal (e.g., the data initialization signal GI) can be applied to the gate terminal of the seventh transistor TR7. The initialization voltage VINT can be applied to the first terminal of the seventh transistor TR7. The first terminal of the seventh transistor TR7 can be connected to the first terminal of the OLED. In example embodiments, the first terminal of the seventh transistor TR7 is a source terminal, and the second terminal of the seventh transistor TR7 is a drain terminal. In some example embodiments, the first terminal of the seventh transistor TR7 is a drain terminal, and the second terminal of the seventh transistor TR7 is a source terminal.

The seventh transistor TR7 can apply the initialization voltage VINT to the first terminal of the OLED while the diode initialization signal is activated. In this case, the seventh transistor TR7 can operate in the linear region. Thus, the seventh transistor TR7 can initialize the first terminal of the OLED as the initialization voltage VINT while the diode initialization signal is activated.

In example embodiments, the data initialization signal GI and the diode initialization signal are the same signal. An initialization operation of the gate terminal of the first transistor TR1 can do not affect an initialization operation of the first terminal of the OLED. Therefore, the data initialization signal GI is used as the diode initialization signal, thereby improving the manufacturing efficiency.

The eighth transistor TR8 can include a gate terminal, a first terminal, and a second terminal. The emission signal EM can be applied to the gate terminal of the eighth transistor TR8. The first terminal of the eighth transistor TR8 can be connected to the second terminal of the first transistor TR1. The second terminal can be connected to the first terminal of the OLED. In example embodiments, the first terminal of the eighth transistor TR8 is a source terminal, and the second terminal of the eighth transistor TR8 is a drain terminal. In some example embodiments, the first terminal of the eighth transistor TR8 is a drain terminal, and the second terminal of the eighth transistor TR8 is a source terminal.

The eighth transistor TR8 can provide the driving current ID generated by the first transistor TR1 to the OLED while the emission signal EM is activated. In this case, the eighth transistor TR8 can operate in the linear region. Thus, the eighth transistor TR8 can provide the driving current ID generated by the first transistor TR1 to the OLED while the emission signal EM is activated such that the OLED emits light. In addition, the eighth transistor TR8 can disconnect the first transistor TR1 from the OLED while the emission signal EM is inactivated such that the compensated data signal DATA applied to the second terminal of the first transistor TR1 is applied to the gate terminal of the first transistor TR1.

The ninth transistor TR9 can apply the first power voltage ELVDD to the first terminal of the first transistor TR1 while the emission signal EM is activated. In some embodiments, the ninth transistor TR9 does not apply the first power voltage ELVDD while the emission signal EM is inactivated. In this case, the ninth transistor TR9 can operate in the linear region. The ninth transistor TR9 can apply the first power voltage ELVDD to the first terminal of the first transistor TR1 while the emission signal EM is activated such that the first transistor TR1 generates the driving current ID. In addition, in some embodiments, the ninth transistor TR9 does not apply the first power voltage ELVDD while the emission signal EM is inactivated such that the data signal DATA applied to the first terminal of the first transistor TR1 is applied to the gate terminal of the first transistor TR1.

The storage capacitor CST can be connected between a first power voltage ELVDD line and the gate terminal of the first transistor TR1. The storage capacitor CST can maintain a voltage level of the gate terminal of the first transistor TR1 while the scan signal GW is inactivated. An emission signal EM can be activated while the scan signal GW is inactivated. The driving current ID generated by the first transistor TR1 can be provided to the OLED while the emission signal EM is activated. Therefore, the driving current ID generated by the first transistor TR1 can be provided to the OLED based on the voltage level maintained by the storage capacitor CST.

FIGS. 2 through 8 are layout diagrams illustrating an OLED display including the pixel in accordance with example embodiments.

Figure 2:
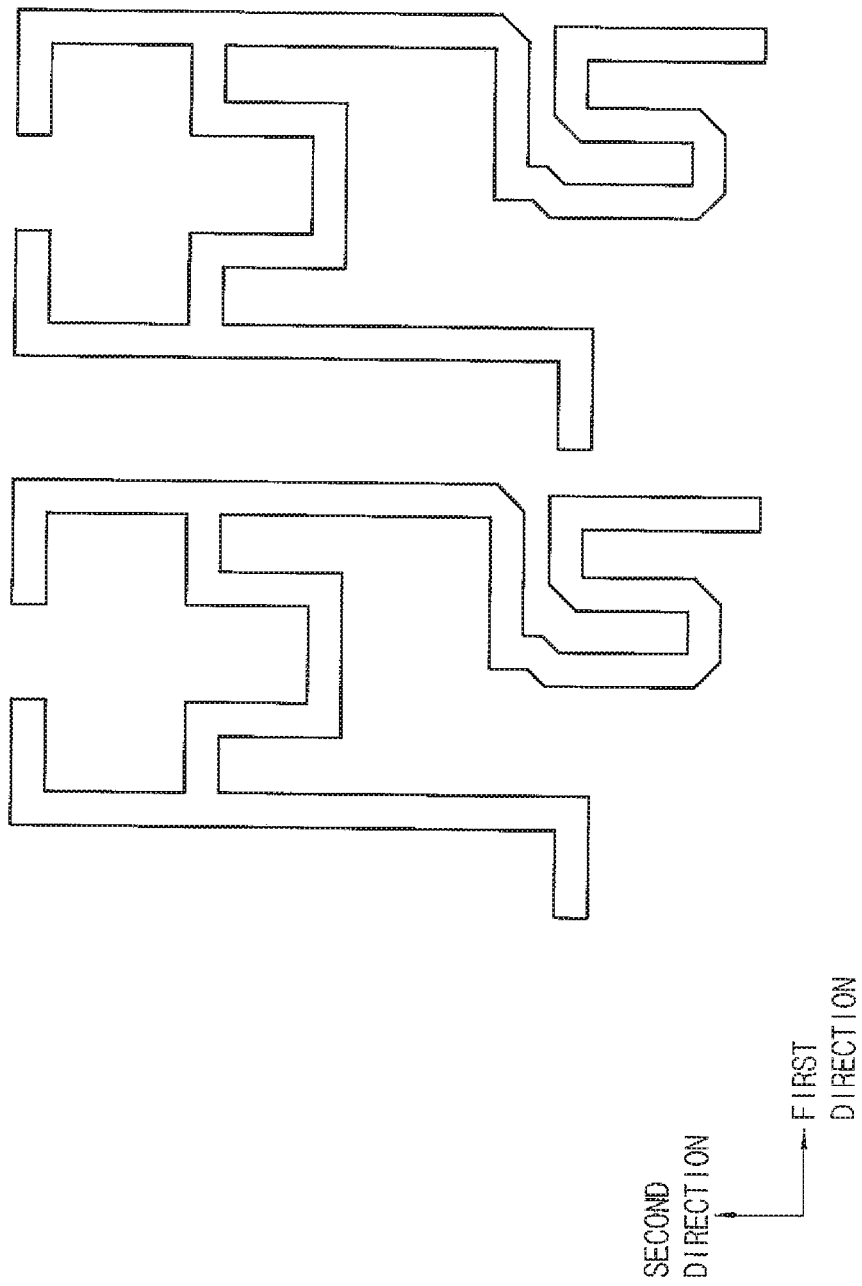
FIG. 2 is a layout diagram illustrating an OLED display including the pixel in accordance with example embodiments.
Figure 3:
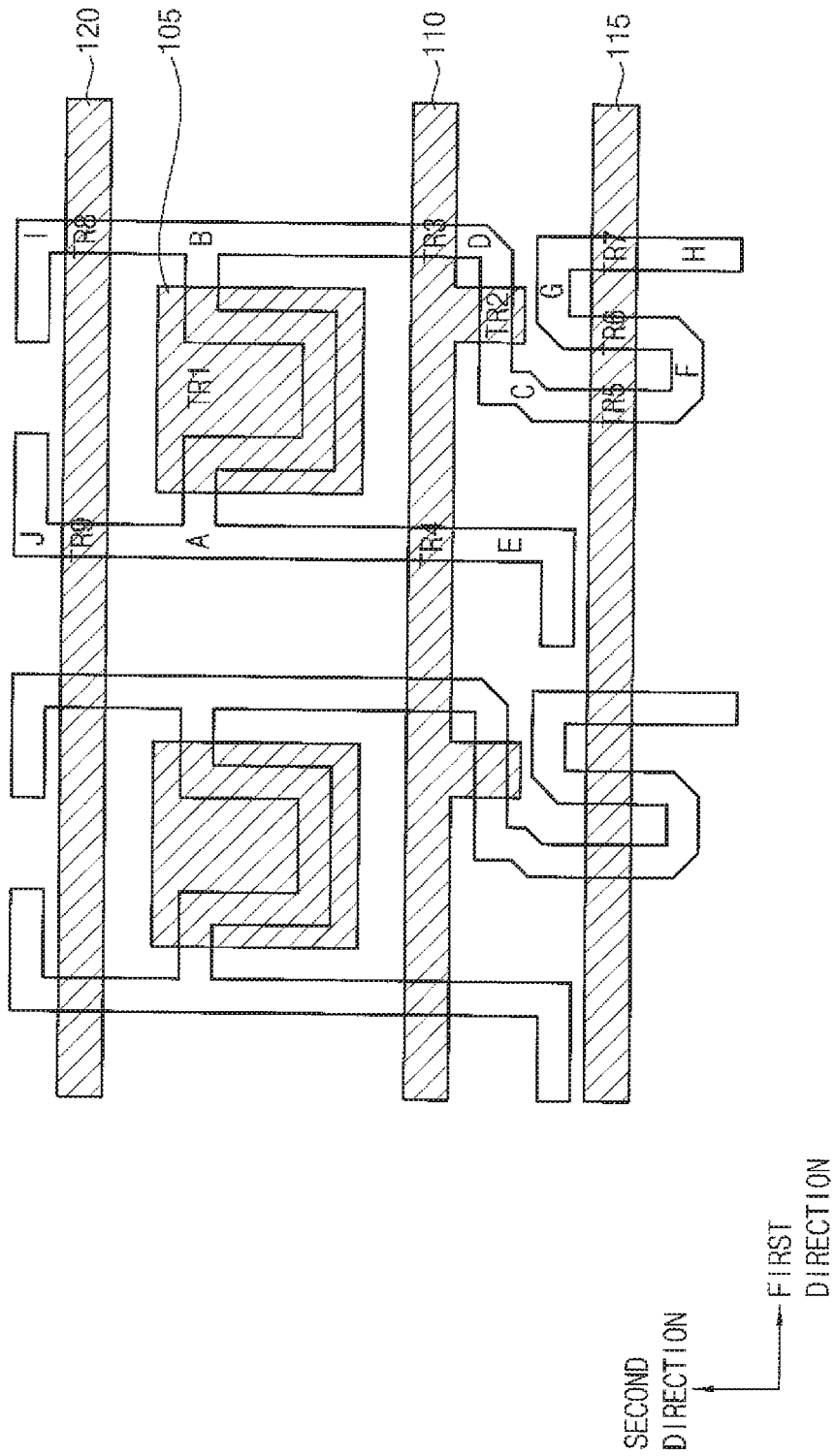
FIG. 3 is a layout diagram illustrating an OLED display including the pixel in accordance with example embodiments.

Referring to FIGS. 2 and 3, an OLED display includes a substrate (not illustrated), an active pattern 100, a gate insulation layer (not illustrated), a first gate electrode 105, a second gate electrode 110, a third gate electrode 115, a forth gate electrode 120, etc.

The substrate can be formed of an insulation material, such as a glass, a transparent plastic, a transparent metal oxide, etc. Although it is not illustrated, one or more buffer layer can be provided on the substrate. For example, the buffer layer is formed of silicon oxide, silicon nitride, silicon oxynitride, etc.

The active pattern 100 can be formed on the substrate. The active pattern 100 can be formed of silicon. Alternatively, the active pattern 100 can be formed of a semiconductor oxide including a binary compound (ABx), a ternary compound (ABxCy), a quaternary compound (ABxCyDz), etc. which include one or more of indium, zinc, gallium, tin, titanium, aluminum, hafnium (Hf), zirconium (Zr), magnesium (Mg), etc. These compounds can be used alone or in combination thereof.

The active pattern 100 can include first through tenth regions A, B, C, D, E, F, G, H, I, and J. The regions A, B, C, D, E, F, G, H, I, and J can be doped with an impurity, and thus can have electrical conductivity higher than those of other regions of the active pattern 100. The regions A, B, C, D, E, F, G, H, I, and J can be source terminals or drain terminals of first through ninth transistors TR1, TR2, TR3, TR4, TR5, TR6, TR7, TR8, and TR9. In some embodiments, boundaries between the regions A, B, C, D, E, F, G, H, I, and J are not discrete, and the regions A, B, C, D, E, F, G, H, I, and J can be electrically connected to each other. In example embodiments, the active pattern 100 is repeatedly formed in a first direction that is substantially parallel to an upper surface of the substrate.

The gate insulation layer can be formed on the substrate to cover the active pattern 100. The gate insulation layer can be formed of a silicon compound, metal oxide, etc. For example, the gate insulation layer is formed of silicon oxide, silicon nitride, silicon oxynitride, aluminum oxide, tantalum oxide, hafnium oxide, zirconium oxide, titanium oxide, etc., which can be used alone or in combination thereof. In example embodiments, the gate insulation layer has a multilayer structure including a silicon oxide layer and a silicon nitride layer.

The first gate electrode 105, the second gate electrode 110, the third gate electrode 115, and the fourth gate electrode 120 can be formed on the gate insulation layer. The first gate electrode 105, the second gate electrode 110, the third gate electrode 115, and the fourth gate electrode 120 can be formed at the same level. The first gate electrode 105, the second gate electrode 110, the third gate electrode 115, and/or the fourth gate electrode 120 can be formed of a metal, an alloy, metal nitride, conductive metal oxide, transparent conductive materials, etc. For example, the first gate electrode 105, the second gate electrode 110, the third gate electrode 115, and/or the fourth gate electrode 120 are formed of aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), and the alloy or a conductive nitride thereof. Alternatively, the first gate electrode 105, the second gate electrode 110, the third gate electrode 115, and/or the fourth gate electrode 120 can be formed of strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), etc.

The first gate electrode 105 can form or define the first transistor TR1 together with the first region A and the second region B. In example embodiments, the first region A is a source region, and the second region B is a drain region. Alternatively, the first region A can be a drain region, and the second region B can be a source region. The first region A and the second region B can be doped with the impurity. However, in some embodiments, a region of the active pattern 100 under the first gate electrode 105 is not be doped with the impurity. Thus, the first region A and the second region B can operate as conductors, and the region of the active pattern 100 under the first gate electrode 105 can operate as a channel of the first transistor TR1. Accordingly, the first transistor TR1 can be capable of generating a driving current ID of FIG. 1 provided to an OLED, and the OLED can emit light based on the driving current ID.

The second gate electrode 110 can include a second gate extended portion and a second gate protruding portion. Here, the second gate extended portion can extend in the first direction, and the second gate protruding portion can protrude from the second gate extended portion in a second direction that is substantially perpendicular to (or crossing) the first direction. The second gate protruding portion can form or define the second transistor TR2 together with the third region C and the fourth region D. For example, the second gate protruding portion serves as a gate electrode of the second transistor TR2. The second gate extended portion can include a first portion and a second portion that is opposite to the first portion. The first portion of the second gate extended portion can form or define the third transistor TR3 together with the second region B and the fourth region D, and the second portion of the second gate extended portion can form or define the fourth transistor TR4 together with the first region A and the fifth region E. Here, the second transistor TR2 and the third transistor TR3 can be in series, and can serve as a dual gate transistor. For example, when the dual transistor is turned-off, leakage current is decreased. Thus, the second transistor TR2 and the third transistor TR3 can be electrically connected via the fourth region D. In addition, the first transistor TR1, the fourth transistor TR4, and the ninth transistor TR9 can be electrically connected via the first region A, and the first transistor TR1, the third transistor TR3, and the eighth transistor TR8 can be electrically connected via the second region B. In example embodiments, the fourth region D is a first node N1 of FIG. 1, and the third region C can be a second node N2 of FIG. 1.

The first region A, the second region B, the third region C, the fourth region D, and the fifth region E can be doped with the impurity. However, in some embodiments, regions of the active pattern 100 under the second gate electrode 110 are not doped with the impurity. Thus, the first region A, the second region B, the third region C, the fourth region D, and the fifth region E can operate as the conductors, and the regions of the active pattern 100 under the second gate electrode 110 can operate as channels of the second transistor TR2, the third transistor TR3, and the fourth transistor TR4. In example embodiments, the second gate electrode 110 receives a scan signal GW illustrated in FIG. 1.

In example embodiments, each of the third region C of the second transistor TR2, the fourth region D of the third transistor TR3, and the fifth region E of the fourth transistor TR4 is a source region, and each of the fourth region D of the second transistor TR2, the second region B of the third transistor TR3, and the first region A of the fourth transistor TR4 is a drain region. Alternatively, each of the third region C of the second transistor TR2, the fourth region D of the third transistor TR3, and the fifth region E of the fourth transistor TR4 can be a drain region, and each of the fourth region D of the second transistor TR2, the second region B of the third transistor TR3, and the first region A of the fourth transistor TR4 can be a source region.

The third gate electrode 115 can extend in the first direction. The third gate electrode 115 can form or define the fifth transistor TR5 together with the third region C and the sixth region F, and can form or define the sixth transistor TR6 together with the sixth region F and the seventh region G. In addition, the third gate electrode 115 can form or define the seventh transistor TR7 together with the seventh region G and the eighth region H. Here, the fifth transistor TR5 and the sixth transistor TR6 can be in series, and can serve as a dual gate transistor. For example, when the dual transistor is turned-off, leakage current is decreased. Thus, the fifth transistor TR5 and the sixth transistor TR6 can be electrically connected via the sixth region F. In addition, the sixth transistor TR6 and the seventh transistor TR7 can be electrically connected to the seventh region G, and the eighth region H can be electrically connected to the ninth region I.

The third region C, the sixth region F, the seventh region G, and the eighth region H can be doped with the impurity. However, in some embodiments, regions of the active pattern 100 under the third gate electrode 115 are not doped with the impurity. Thus, the third region C, the sixth region F, the seventh region G, and the eighth region H can operate as the conductors, and the regions of the active pattern 100 under the third gate electrode 115 can operate as channels of the fifth transistor TR5, the sixth transistor TR6, and the seventh transistor TR7. In example embodiments, the third gate electrode 115 receives a data initialization signal GI of FIG. 1, the seventh region G can receive an initialization voltage VINT illustrated in FIG. 1.

In example embodiments, each of the third region C of the fifth transistor TR5, the sixth region F of the sixth transistor TR6, and the seventh region G of the seventh transistor TR7 is a source region, and each of the sixth region F of the fifth transistor TR5, the seventh region G of the sixth transistor TR6, the eighth region H of the seventh transistor TR7 is a drain region. Alternatively, the each of the third region C of the fifth transistor TR5, the sixth region F of the sixth transistor TR6, and the seventh region G of the seventh transistor TR7 can be a drain region, and the sixth region F of the fifth transistor TR5, the seventh region G of the sixth transistor TR6, the eighth region H of the seventh transistor TR7 can be a source region.

The fourth gate electrode 120 can form or define the eighth transistor TR8 together with the second region B and the ninth region I, and can form or define the ninth transistor TR9 together with the first region A and the tenth region J.

The first region A, the second region B, the ninth region I, and the tenth region J can be doped with the impurity. However, in some embodiments, regions of the active pattern 100 under the fourth gate electrode 120 are not doped with the impurity. Thus, the first region A, the second region B, the ninth region I, and the tenth region J can operate as the conductors, and the regions of the active pattern 100 under the fourth gate electrode 120 can operate as channels of the eighth transistor TR8 and the ninth transistor TR9. In example embodiments, the fourth gate electrode 120 receives an emission signal EM illustrated in FIG. 1.

In example embodiments, each of the ninth region I of the eighth transistor TR8 and the tenth region J of the first pixel column 10 is a source region, and the each of the second region B of the eighth transistor TR8 and the first region A of the ninth transistor TR9 is a drain region. Alternatively, each of the ninth region I of the eighth transistor TR8 and the tenth region J of the first pixel column 10 can be drain region, and the each of the second region B of the eighth transistor TR8 and the first region A of the ninth transistor TR9 can be source region.

Figure 4:
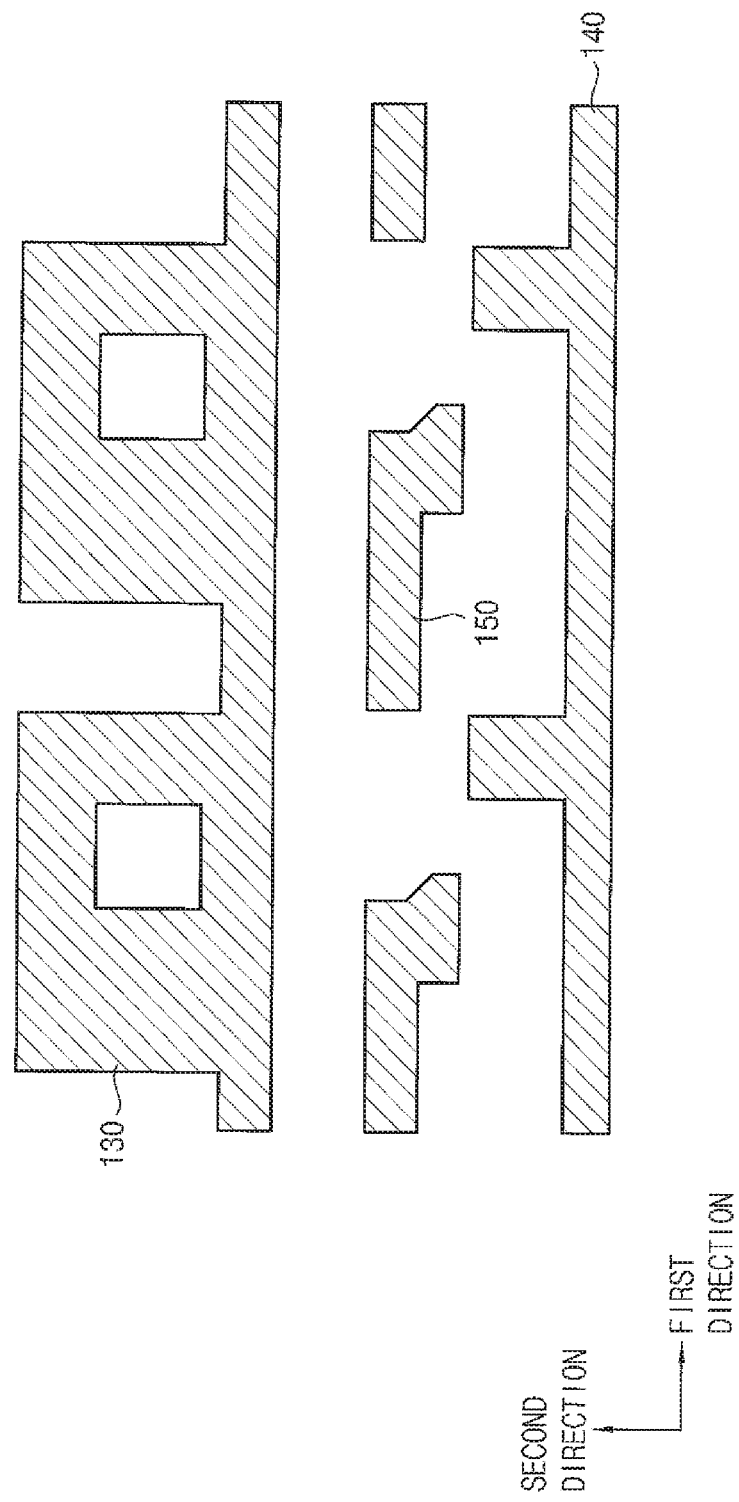
FIG. 4 is a layout diagram illustrating an OLED display including the pixel in accordance with example embodiments.
Figure 5:
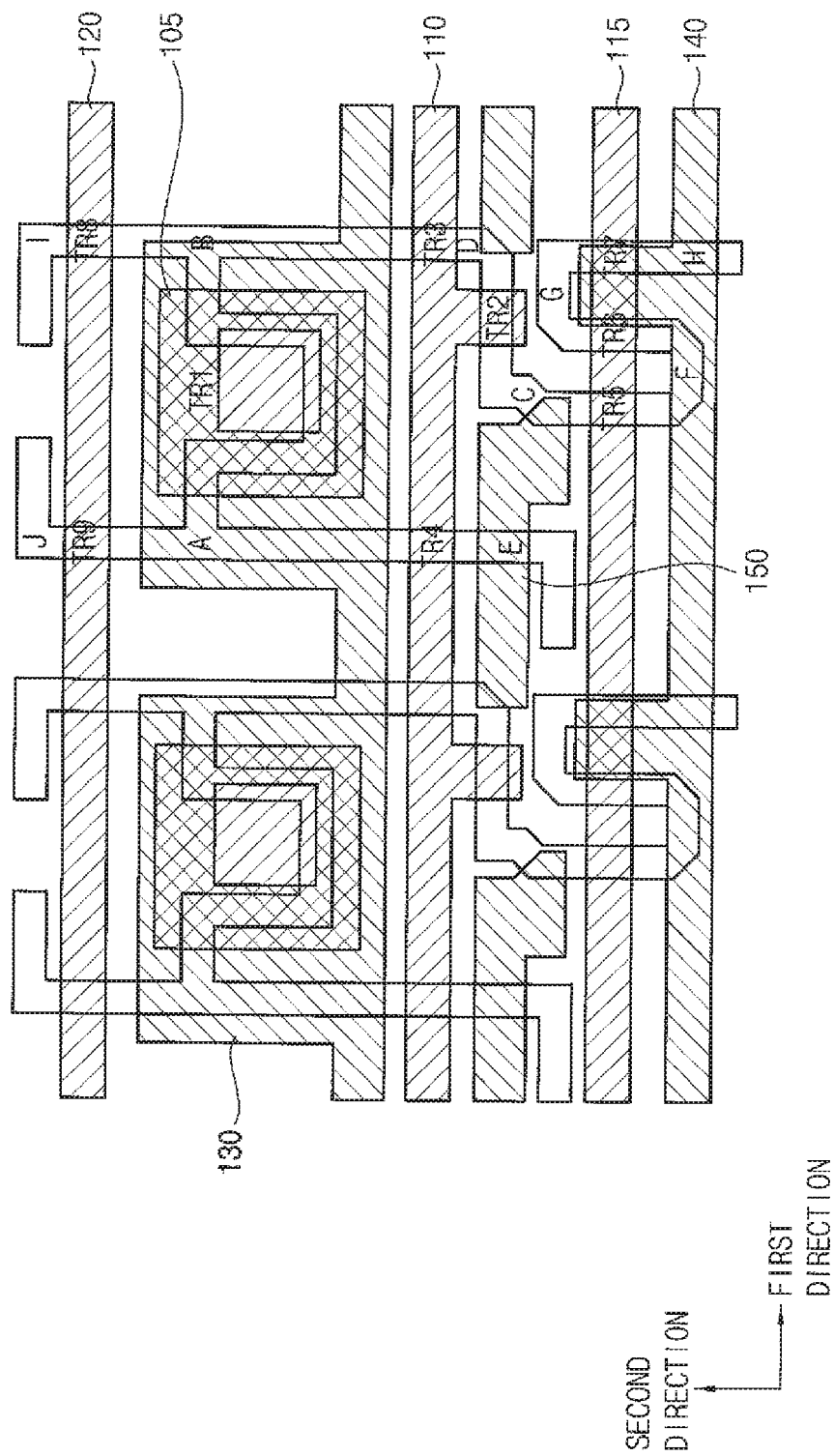
FIG. 5 is a layout diagram illustrating an OLED display including the pixel in accordance with example embodiments.

Referring to FIGS. 4 and 5, an OLED display includes a substrate (not illustrated), an active pattern 100, a gate insulation layer (not illustrated), a first gate electrode 105, a second gate electrode 110, a third gate electrode 115, and a forth electrode 120 as shown in FIGS. 2 and 3. The OLED display can further include a first insulating interlayer (not illustrated), a first conductive pattern 150, a second conductive pattern 130, and a second power supply voltage line 140.

The first insulating interlayer can be formed on the gate insulation layer to cover the first gate electrode 105, the second gate electrode 110, the third gate electrode 115, and the fourth gate electrode 120. In example embodiments, the first insulating interlayer sufficiently covers the first gate electrode 105, the second gate electrode 110, the third gate electrode 115, and the fourth gate electrode 120, and has a substantially level surface without a step around the first gate electrode 105, the second gate electrode 110, the third gate electrode 115, and the fourth gate electrode 120. In some example embodiments, the first insulating interlayer covers the first gate electrode 105, the second gate electrode 110, the third gate electrode 115, and the fourth gate electrode 120, and is formed with a substantially uniform thickness along a profile of the first gate electrode 105, the second gate electrode 110, the third gate electrode 115, and the fourth gate electrode 120. The first insulating interlayer can be formed of an organic material, such as a silicon compound, or an inorganic material, such as a transparent insulating resin. For example, the first insulating interlayer is formed of silicon oxide, silicon nitride, silicon oxynitride, and etc. These can be used alone or in combination with each other.

The first conductive pattern 150, the second conductive pattern 130, and the second power supply voltage line 140 can be formed on the first insulating interlayer. Each of the first conductive pattern 150, the second conductive pattern 130, the second power supply voltage line 140 can be formed of a metal, an alloy, metal nitride, conductive metal oxide, transparent conductive materials, etc. These can be used alone or in a suitable combination thereof. That is, the first conductive pattern 150, the second conductive pattern 130, and the second power supply voltage line 140 can be substantially simultaneously or concurrently formed using the same materials. The fourth region D can be a first node N1 of FIG. 1, and the third region C can be a second node N2 of FIG. 1.

The first conductive pattern 150 can overlap at least a portion the fourth region D (e.g., a first node N1) and at least a portion the third region C (e.g., a second node N1). For example, the first conductive pattern 150 overlaps the fourth region D of a first pixel and the third region C of a second pixel that is adjacent to the first pixel. That is, the first conductive pattern 150 can be interposed between the second gate electrode 110 and the third gate electrode 115 on the substrate, and can extend in the first direction. In addition, in some embodiments, the first conductive pattern 150 does not overlap the second gate electrode 110 and/or the third gate electrode 115. Accordingly, the first conductive pattern 150 can form or define first and second parasitic capacitors CP1 and CP2 together with the at least a portion the fourth region D and the at least a portion the third region C. In addition, the first conductive pattern 150 can overlap at least a portion the fifth region E. The first conductive pattern 150 can receive a first power supply voltage ELVDD illustrated in FIG. 1 via a first power supply voltage line that will be described below.

The second conductive pattern 130 can overlap the first gate electrode 105. Thus, the second conductive pattern 130 can form or define a storage capacitor CST illustrated in FIG. 1 together with the first gate electrode 105. The second conductive pattern 130 can extend in a direction substantially parallel to an upper surface of the substrate from an overlapped portion with the first gate electrode 105. As a result, the second conductive pattern 130 can be formed to partially overlap the first and second regions A and B of the active pattern 100. That is, the conductive pattern 132 can be formed to overlap with the source node of the active pattern 100. In example embodiments, the second conductive pattern 130 receives the first power voltage ELVDD illustrated in FIG. 1. In addition, the second conductive pattern 130 can have an opening that exposes at least a portion the first gate electrode 105. A fourth contact hole of a second connection pattern that will be described below can be located in the opening of the first gate electrode 105, and the first gate electrode 105 can receive the initialization voltage VINT illustrated in FIG. 1 via the fourth contact hole.

The second power supply voltage line 140 can include a second power supply extended portion and a second power supply protruding portion. The second power supply extended portion can extend in the first direction, and the second power supply protruding portion can be protruded from the second power supply extended portion in the second direction. Here, the second power supply protruding portion can overlap at least a portion the third gate electrode 115. A third contact hole of a first connection pattern that will be described below can be located in the second power supply protruding portion of the second power supply voltage line 140. A second contact hole of the first connection pattern can be located in the seventh region G. A second power supply voltage can be applied to the seventh region G via the second and third contact holes of the first connection pattern.

Figure 6:
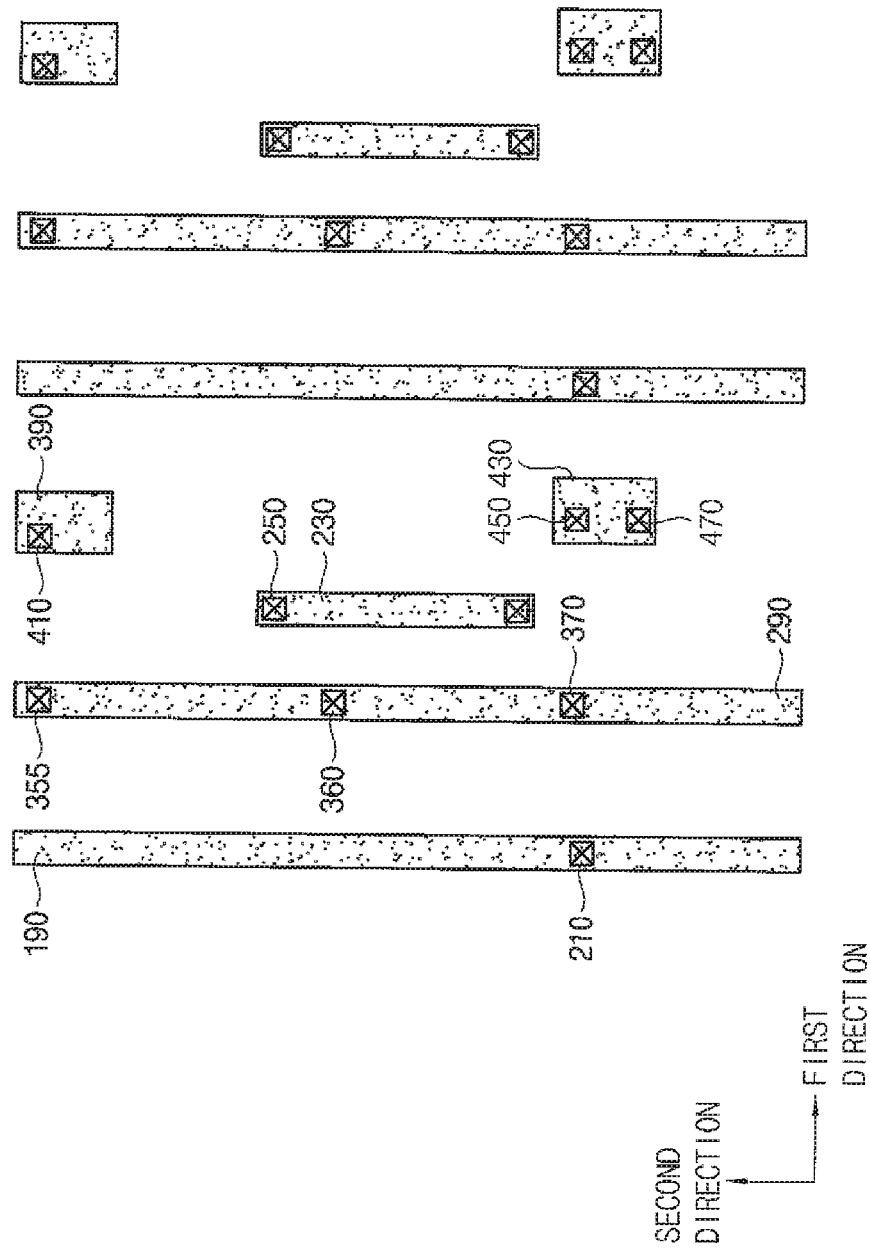
FIG. 6 is a layout diagram illustrating an OLED display including the pixel in accordance with example embodiment.
Figure 7:
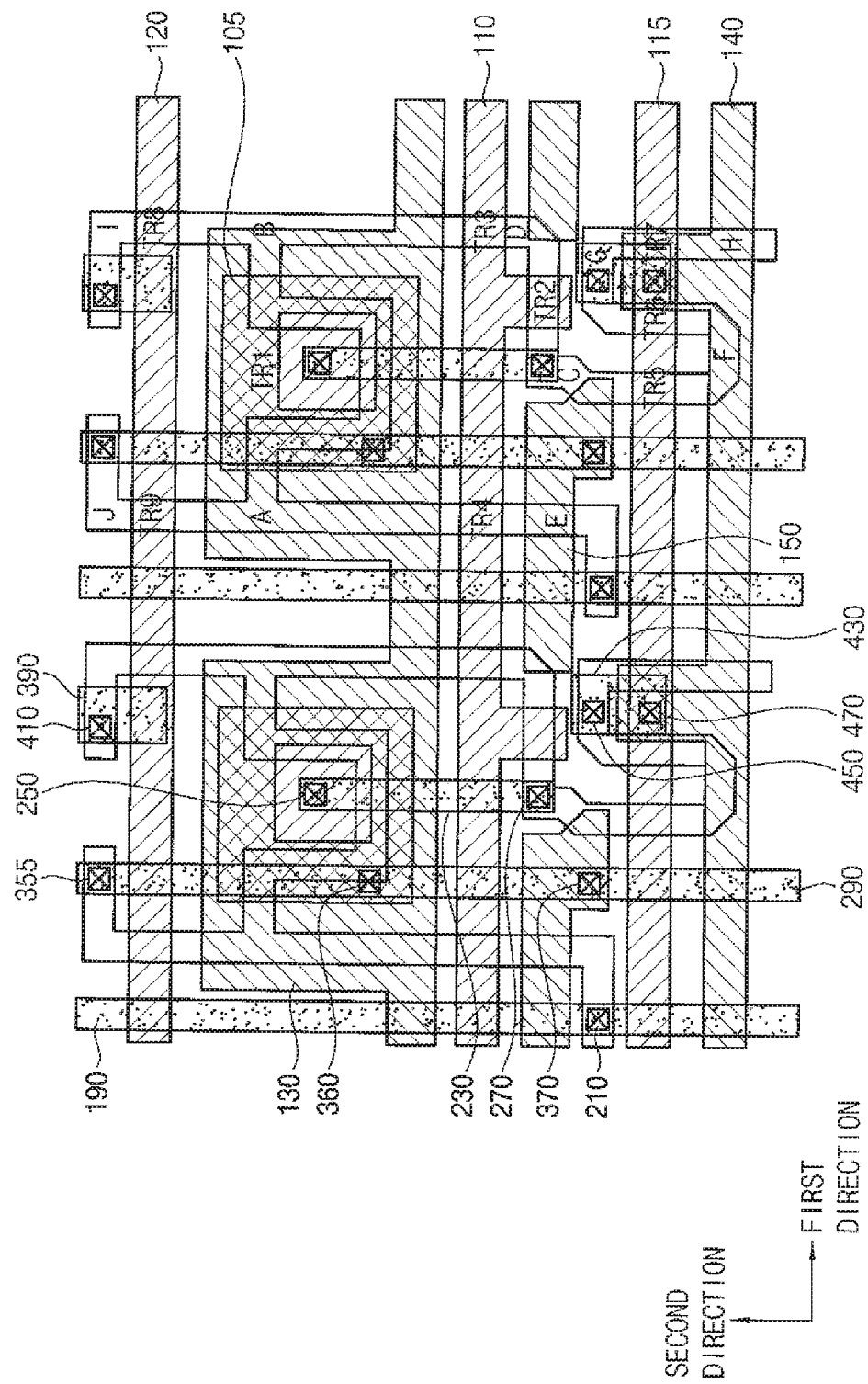
FIG. 7 is a layout diagrams illustrating an OLED display including the pixel in accordance with example embodiment.

Referring to FIGS. 6 and 7, an OLED display includes a substrate (not illustrated), an active pattern 100, a gate insulation layer (not illustrated), a first gate electrode 105, a second gate electrode 110, a third gate electrode 115, a forth electrode 120, a first insulating interlayer (not illustrated), a first conductive pattern 150, a second conductive pattern 130 and a second power supply voltage line 140, etc. as shown in FIGS. 2 through 5. The OLED display can further include a second insulating interlayer (not illustrated), a first power supply voltage line 290, a first connection pattern 430, a second connection pattern 230, a third connection pattern 390, and a data line 190.

The second insulating interlayer can be formed on the first insulating interlayer to cover the first conductive pattern 150, the second conductive pattern 130, and the second power supply voltage line 140. In example embodiments, the second insulating interlayer sufficiently covers the first conductive pattern 150, the second conductive pattern 130, and the second power supply voltage line 140, and has a substantially flat upper surface without a difference of elevation around the first conductive pattern 150, the second conductive pattern 130, and the second power supply voltage line 140. Alternatively, the second insulating interlayer can cover the first conductive pattern 150, the second conductive pattern 130, and the second power supply voltage line 140, and can be formed with a substantially uniform thickness along a profile of the first conductive pattern 150, the second conductive pattern 130, and the second power supply voltage line 140. The second insulating interlayer can be formed of an organic material, such as a silicon compound, or an inorganic material, such as a transparent insulating resin. For example, the first insulating interlayer is formed of silicon oxide, silicon nitride, silicon oxynitride, and etc. These can be used alone or in combination with each other.

The first power supply voltage line 290, the first connection pattern 430, the second connection pattern 230, the third connection pattern 390 and the data line 190 can be formed on the second insulating interlayer. The first power supply voltage line 290, the first connection pattern 430, the third connection pattern 390, and the data line 190 can be formed of a metal, an alloy, metal nitride, conductive metal oxide, transparent conductive materials, etc. These can be used alone or in combination with each other.

The data line 190 can be electrically connected to the fifth region E of the active pattern 100. For example, the data line 190 fills a fourth contact hole 210, and is connected to the fifth region E via the first contact hole 210. In example embodiments, the data line 190 receives a data signal DATA illustrated of FIG. 1. As a result, the data line 190 can provide the data signal DATA to the fifth region E via the first contact hole 210. Here, a voltage level of the data signals DATA can be changed according to the change of a gradation.

The first connection pattern 430 can partially overlap the seventh region G and the second power supply protruding portion on the second insulating interlayer. For example, a second contact hole 450 of the first connection pattern 430 is located on the seventh region G, and a third contact hole 470 of the first connection pattern 430 is located on the second power supply protruding portion. The first connection pattern 430 can contact each of the seventh region G and the second power supply protruding portion via the second contact hole 450 and the third contact hole 470, respectively. The seventh region G and the second power supply protruding portion can be electrically connected via the first connection pattern 430.

In example embodiments, the second power supply voltage line 140 receives the initialization voltage VINT. As a result, the second power supply voltage line 140 can provide the initialization voltage VINT to the seventh region G via the first connection pattern 430.

The second connection pattern 230 can extend in the second direction on the second insulating interlayer, and can be electrically connected to at least a portion the third region C of the active pattern 100 and at least a portion the first gate electrode 105. For example, the second connection pattern 230 contacts the at least a portion the third region C (e.g., a second node N2) via a fifth contact hole 270, and contacts the at least a portion the first gate electrode 105 via a fourth contact hole 250 that is located in the opening of the second conductive pattern 130. That is, the second connection pattern 230 can be electrically connected to the third region C and the first gate electrode 105 via the fourth contact hole 250 and the fifth contact hole 270. In example embodiments, the second connection pattern 230 receives the initialization voltage VINT provided through the fifth transistor TR5 and the sixth transistor TR6. As a result, the second connection pattern 230 can provide the initialization voltage VINT to the first gate electrode 105 via the fourth contact hole 250 and the fifth contact hole 270.

The first power supply voltage line 290 can extend in the second direction on the second insulating interlayer. The first power supply voltage line 290 can be in contact with the tenth region J of the active pattern 100 via a sixth contact hole 355, can be in contact with the second conductive pattern 130 via a seventh contact hole 360. In addition, the first power supply voltage line 290 can be in contact with the first conductive pattern 150 via an eighth contact hole 370. That is, the first power supply voltage line 290 can be electrically connected to each of the tenth region J, the second conductive pattern 130, and the first conductive pattern 150 via the sixth contact hole 355, the seventh contact hole 360, and the eighth contact hole 370, respectively. The first power supply voltage line 290 can provide the first power supply voltage ELVDD to the tenth region J, the second conductive pattern 130, and the first conductive pattern 150.

The third connection pattern 390 can be in contact with the ninth region I of the active pattern 100 via a ninth contact hole 410. The third connection pattern 390 can be in contact with a first electrode that will be described below, and a driving current can be applied to the first electrode.

When the first conductive pattern 150 is not formed, crosstalk can occur in the third and fourth regions C and D that are adjacent to a data signal line 190 according to the change of voltage level of the data signals DATA. Accordingly, the stain can be displayed in the OLED display.

In example embodiments, the first conductive pattern 150 that receives the first power supply voltage ELVDD overlaps at least a portion of the third and fourth regions C and D. The first conductive pattern 150 can form or define first and second parasitic capacitors CP1 and CP2 together with the at least a portion of the fourth region D and the at least a portion the third region C. That is, the first conductive pattern 150 can be interposed between the data line 190 and the third and fourth regions C and D of the active pattern 100 such that the first conductive pattern 150 shields (or electrically disconnects) a parasitic capacitor between the data line 190 and the third and fourth regions C and D of the active pattern 100. As the first conductive pattern 150 receiving the first power supply voltage ELVDD that a voltage level is not changed is formed even though a voltage level of the data signal DATA is changed, the crosstalk can be reduced. Accordingly, the stain is not displayed in the OLED display and a definition of the OLED display can be improved. In addition, when the second conductive pattern 130 and the first conductive pattern 150 are integrally formed, the conductive pattern that is integrally formed can overlap the second gate electrode. Thus, the conductive pattern can be shorted to the second gate electrode 110. In example embodiments, the second conductive pattern 130 is spaced apart from the first conductive pattern 150, and the second conductive pattern 130 the first conductive pattern 150 do not overlap with the second gate electrode 110. Accordingly, the short between the second gate electrode 110 and the conductive patterns can be prevented.

In example embodiments, the OLED display further includes a third insulating interlayer (not illustrated), a first electrode (not illustrated), a pixel defining layer (not illustrated), an organic light emitting layer (not illustrated), and a second electrode (not illustrated).

The third insulating interlayer can be formed on the second insulating interlayer to cover the first power supply voltage line 290, the first connection pattern 430, the second connection pattern 230, the third connection pattern 390, and the data line 190. In example embodiments, the third insulating interlayer sufficiently covers the first power supply voltage line 290, the first connection pattern 430, the second connection pattern 230, the third connection pattern 390, and has a substantially flat upper surface without a difference of elevation around the first power supply voltage line 290, the first connection pattern 430, the second connection pattern 230, the third connection pattern 390, and the data line 190. The third insulating interlayer can be formed of an organic material, such as a silicon compound, or an inorganic material, such as a transparent insulating resin. For example, the third insulating interlayer is formed of silicon oxide, silicon nitride, silicon oxynitride, etc. These can be used alone or in combination with each other.

The first electrode can be formed on the third insulating interlayer. For example, the first electrode can be formed on a portion of the third insulating interlayer. The first electrode can be formed of metal, alloy, metal nitride, conductive metal oxide, and transparent conductive material. These can be used alone or in combination with each other.

The first electrode can be formed on a portion of the third insulating interlayer. The first electrode can be formed of a metal, an alloy, metal nitride, conductive metal oxide, transparent conductive materials, etc. The first electrode can be electrically connected to the ninth region I. For example, the first electrode is connected to the ninth region I via the ninth contact hole 410. As a result, the first electrode can receive the driving current ID illustrated in FIG. 1 via the ninth contact hole 410. In example embodiments, the first electrode is an anode electrode. Alternatively, the first electrode can be a cathode electrode.

The pixel defining layer can be formed on the third insulating interlayer. For example, the pixel defining layer is formed on the third insulating interlayer and a portion of the first electrode. An opening of the pixel defining layer can be located at a portion of the first electrode on the third insulating interlayer, and the organic light emitting layer can be formed in the opening. The organic light emitting layer can be formed on the first electrode. In particular, the organic light emitting layer can be formed on the first electrode exposed via the opening of the pixel defining layer. The organic light emitting layer can include a light emitting material that is capable of emitting light. The light emitting material can include organic materials. In example embodiments, the light emitting material is formed of organic materials corresponding to wavelengths of red light, green light, and/or blue light.

The second electrode can be formed on the pixel defining layer and the organic light emitting layer. In example embodiments, the second electrode is formed of a transparent conductive material. For example, the second electrode is formed of indium tin oxide, indium zinc oxide, zinc oxide, tin oxide, gallium oxide, indium oxide, etc. In example embodiments, the second electrode is a cathode electrode. The first electrode, the organic light emitting layer, and the second electrode can form or define the OLED illustrated of FIG. 1. Alternatively, the second electrode can be an anode electrode. In example embodiments, the second electrode receives the third power voltage ELVSS illustrated of FIG. 1.

As a result, the OLED display of FIGS. 2 to 8 includes the pixel of FIG. 1 capable of improving a definition of the organic light emitting diode. As described above, since the first conductive pattern 150 is interposed between the data line 190 and the active pattern 100, the crosstalk capable of being generated in the third and fourth regions C and D can be reduced by shielding the active pattern 100 from the data line 190.

Figure 9:
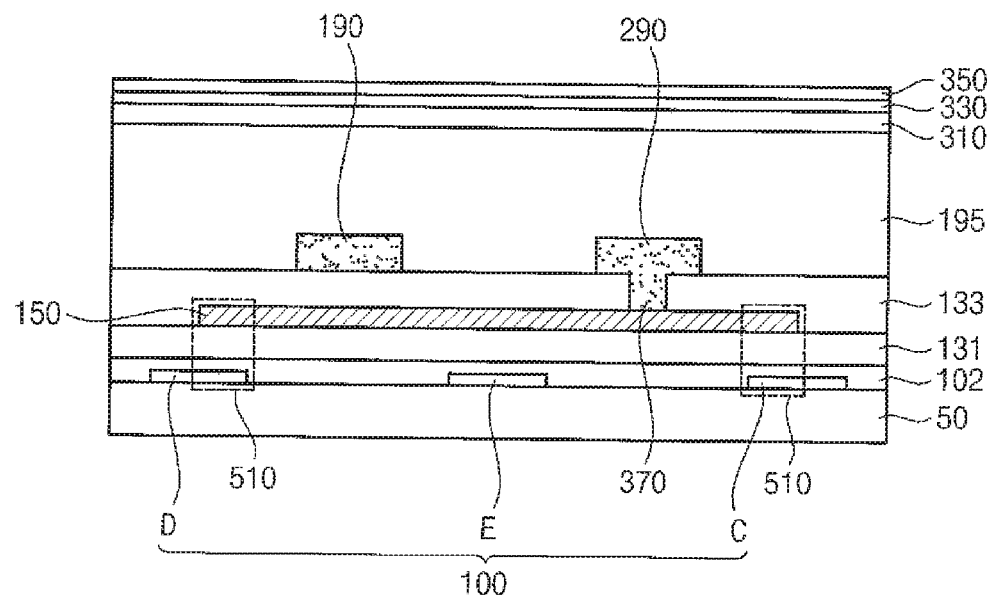
FIG. 9 is a cross-sectional view taken along a line I-I' of FIG. 7.

FIG. 9 is a cross-sectional view taken along a line I-I' of FIG. 7. Referring to FIG. 9, the OLED display includes a substrate 50, an active pattern 100, a gate insulation layer 102, a first insulating interlayer 131, a first conductive pattern 150, a second insulating interlayer 133, a data line 190, a first power supply voltage line 290, a third insulating interlayer 195, a first electrode (or first light-emitting electrode) 310, a pixel defining layer (not illustrated), an organic light emitting layer 330, a second electrode (or second light-emitting electrode) 350, etc.

The active pattern 100 can be formed on the substrate 50. The substrate 50 can be formed of a transparent insulating material such as a glass, a transparent plastic, and a transparent ceramic. The active pattern 100 can include a third region C, a fourth region D, and a fifth region E. The third region C can be a second node N2, and the fourth region D can be a first node N1.

As described above, the gate insulation layer 102 can be formed to cover the active pattern 100. The gate electrodes can be formed on the gate insulation layer 102.

After the second gate electrode is formed, the active pattern 100 can be doped with the impurity. In some embodiments, the third region C, the fourth region D, and the fifth region E can be doped, regions under the gate electrodes are not doped with the impurity. As a result, the third region C, the fourth region D, and the fifth region E can operate as conductors, the regions under the gate electrodes can operate as a channel of the second transistor.

The first insulation interlayer 131 can be formed to cover the gate electrodes on the gate insulation layer 102. The first conductive pattern 150 can be formed on the first insulating interlayer 131. The first conductive pattern 150 can overlap at least a portion the third region C and at least a portion the fourth region D. Each of the overlapped portions 510 and 530 can be parasitic capacitors CP1 and CP2, respectively.

The second insulating interlayer 133 can be formed to cover the first conductive pattern 150. The data line 190 and the first power supply voltage line 290 can be formed on the second insulating interlayer 133. The first power supply voltage line 290 can be in contact with the first conductive pattern 150 via an eighth contact hole 370. The first power supply voltage line 290 can provide the first power supply voltage ELVDD to the first conductive pattern 150. Thus, the first conductive pattern 150 receiving the first power supply voltage ELVDD can have a voltage level that is not changed and shield the third and fourth regions C and D from the data line 190 even though a voltage level of the data signal DATA is changed.

The third insulating interlayer 195 can be formed to cover the data line 190 and the first power supply voltage line 290 on the second insulating interlayer 133. The third insulating interlayer 195 can be formed with a thickness to sufficiently cover the data line 190 and the first power supply voltage line 290. In this case, the third insulating interlayer 195 can have a substantially flat upper surface, and a planarization process can be further performed on the third insulating interlayer 195 to implement the flat upper surface of the third insulating interlayer 195.

The first electrode 310 can be formed on the third insulating interlayer 195. The first electrode 310 can be formed in a portion of the third insulating interlayer 195. For example, the first electrode 310 is electrically connected to the ninth region I via a ninth contact hole (not illustrated). The organic light emitting layer 330 can be formed on the first electrode 310. Finally, the second electrode 350 can be formed on the organic light emitting layer 330.

Figure 8:
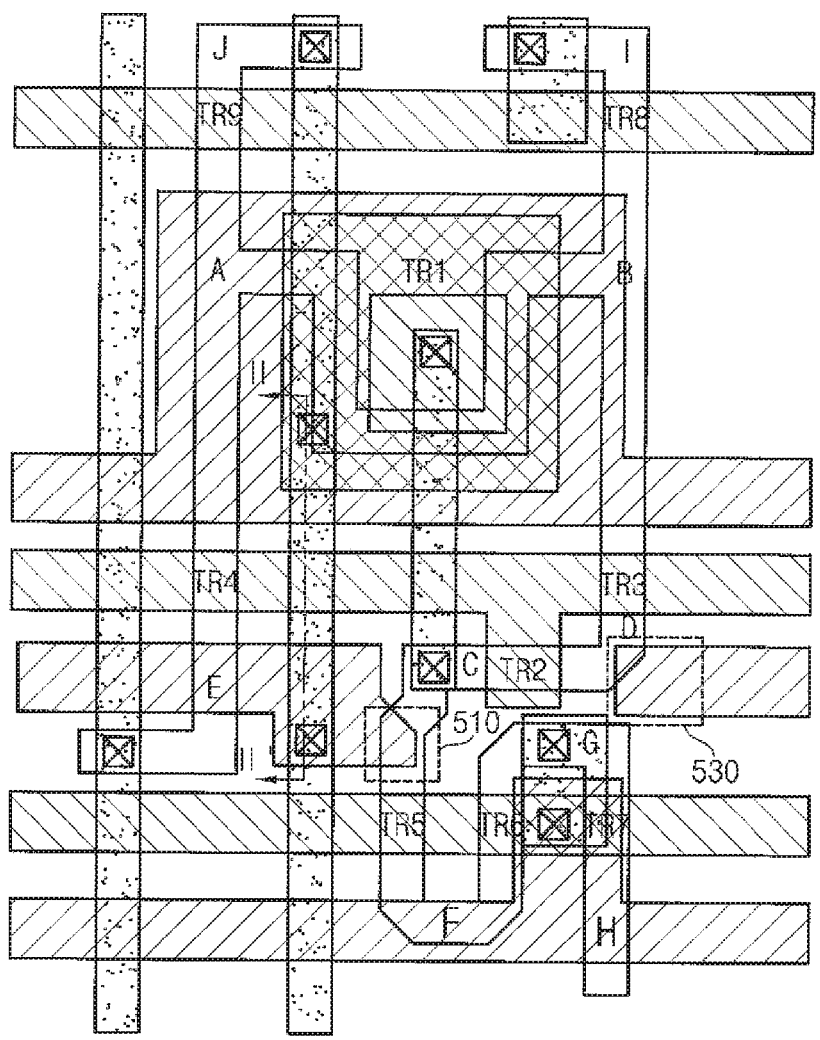
FIG. 8 is a layout diagrams illustrating an OLED display including the pixel in accordance with example embodiment.
Figure 10:
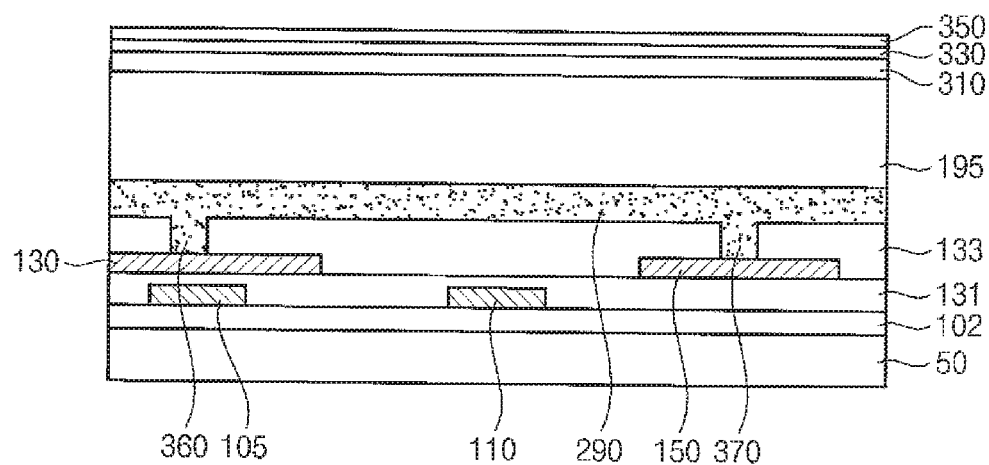
FIG. 10 is a cross-sectional view taken along a line II-II of FIG. 8.
Figure 11:
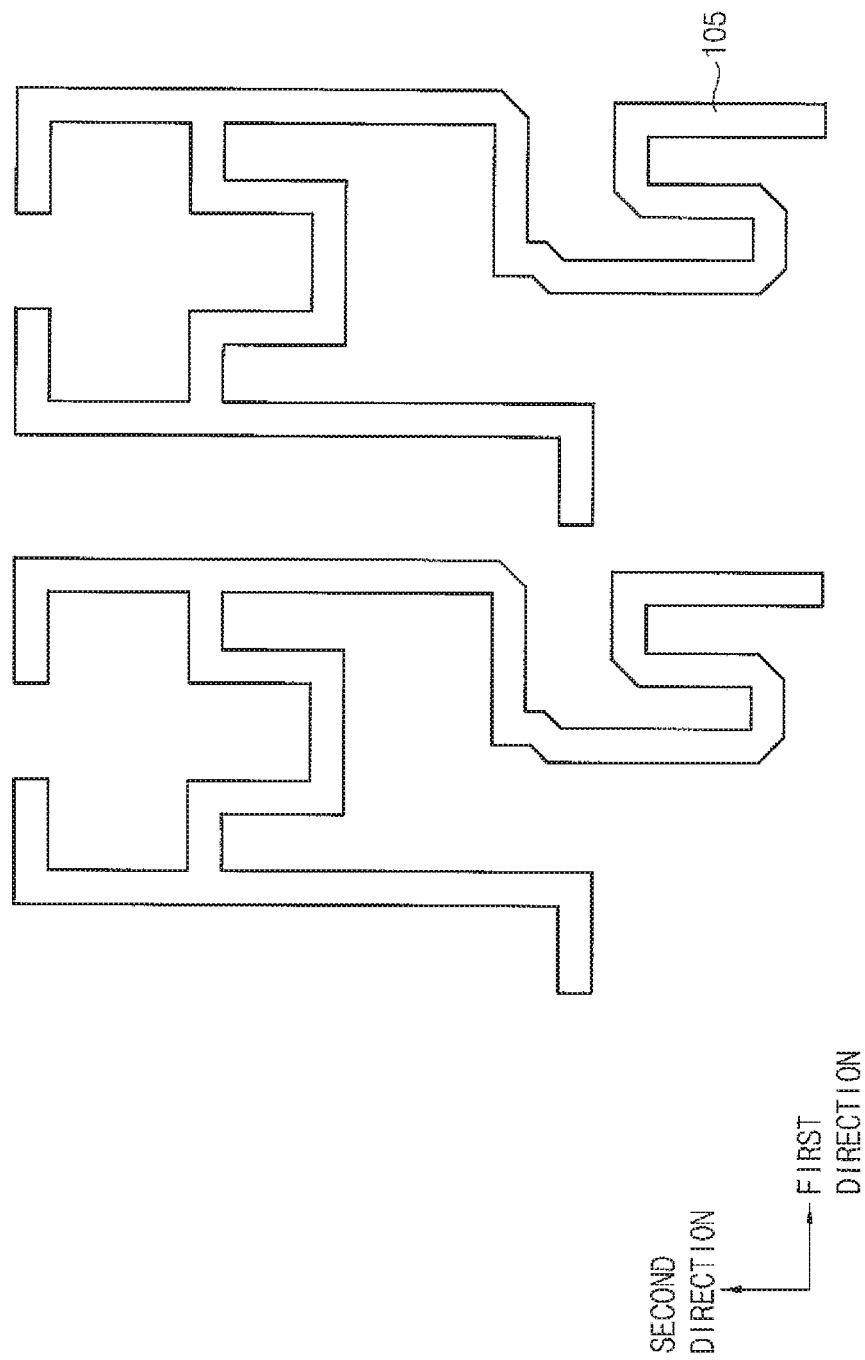
FIG. 11 is a layout diagram illustrating an OLED display including the pixel in accordance with some example embodiments.
Figure 12:
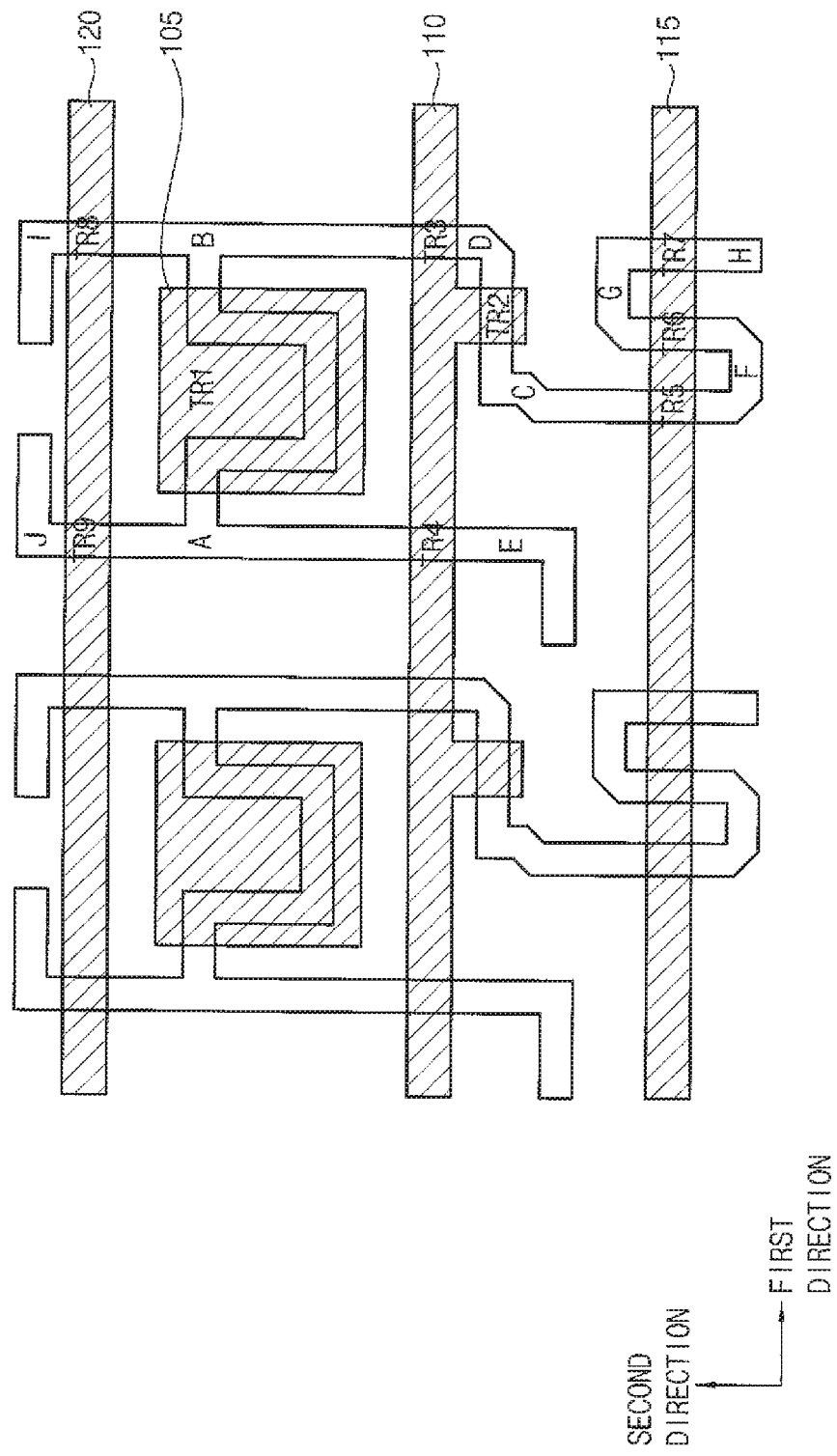
FIG. 12 is a layout diagram illustrating an OLED display including the pixel in accordance with some example embodiments.
Figure 13:
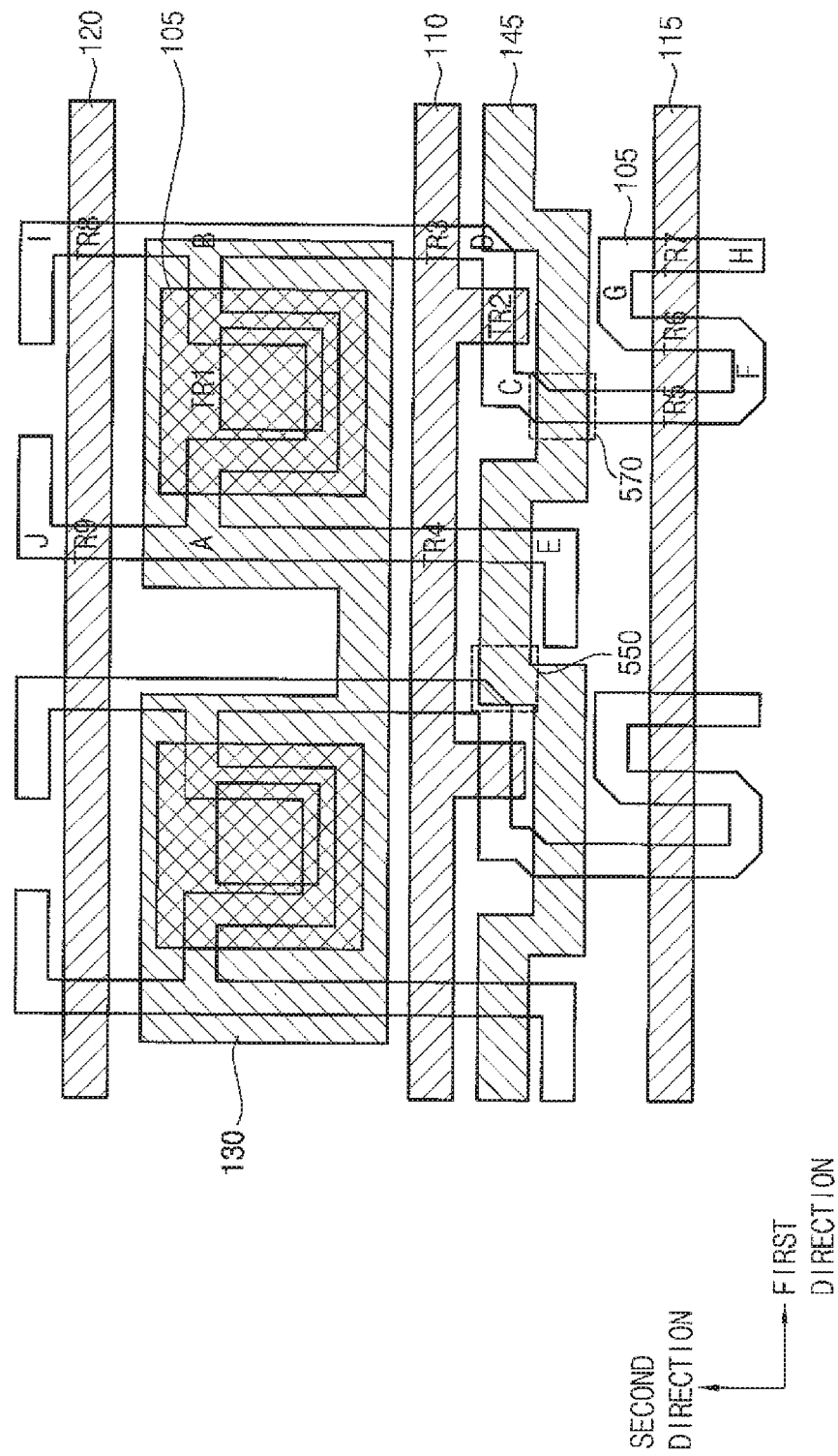
FIG. 13 is a layout diagram illustrating an OLED display including the pixel in accordance with some example embodiments.
Figure 14:
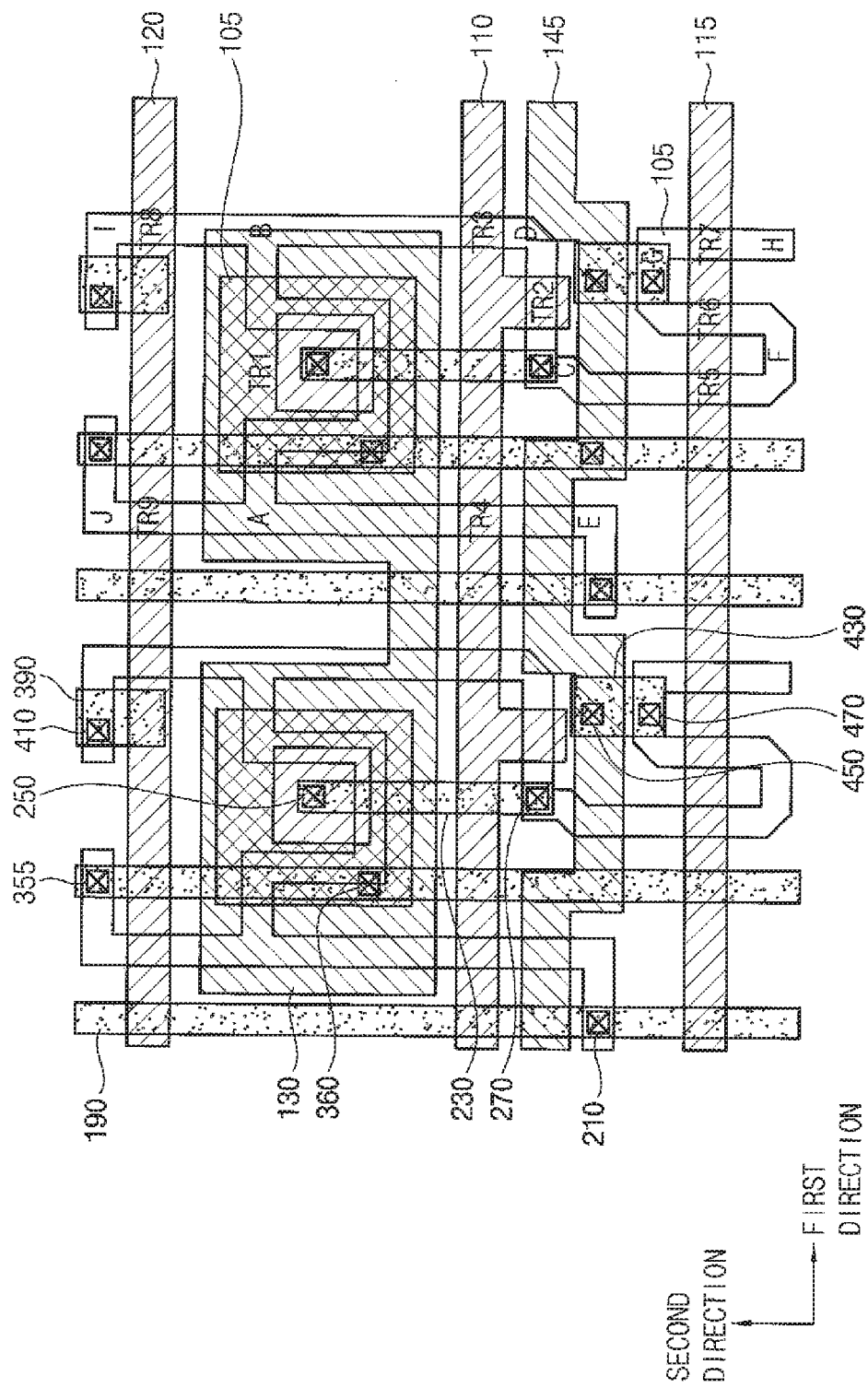
FIG. 14 is a layout diagram illustrating an OLED display including the pixel in accordance with some example embodiments.

FIG. 10 is a cross-sectional view taken along a line II-II of FIG. 8.

Referring to FIG. 10, the OLED display includes a substrate 50, a gate insulation layer 102, a first gate electrode 105, a second gate electrode 110, a first insulating interlayer 131, a second conductive pattern 130, a first conductive pattern 150, a second insulating interlayer 133, a first power supply voltage line 290, a third insulating interlayer 195, a first electrode, a pixel defining layer (not illustrate), an organic light emitting layer 330, a second electrode, etc.

The substrate 50, the gate insulation layer 102, the first conductive pattern 150, the second insulating interlayer 133, and the first power supply voltage line 290, the third insulating interlayer 195, the first electrode, the pixel defining layer (not illustrate), the organic light emitting layer 330, the second electrode can be substantially the same as or similar to configurations described above with reference to FIG. 9.

The first gate electrode 105 and the second gate electrode 110 can be formed on the gate insulation layer 102. The first gate electrode 105 can be spaced apart from the second gate electrode 110. The first insulating interlayer 131 can be formed on the first gate electrode 105 and the second gate electrode 110. The second conductive pattern 130 and the first conductive pattern 150 can be formed on the first insulating interlayer 131. The second conductive pattern 130 can be spaced apart from the first conductive pattern 150. The second conductive pattern 130 can be formed on a portion under which the first gate electrode 105 is located. Here, as the second conductive pattern 130 overlaps the first gate electrode 105, the overlapped portion can be a storage capacitor CST.

In addition, in some embodiments, the second conductive pattern 130 and the first conductive pattern 150 do not overlap the second gate electrode 110. The second insulating interlayer 133 can be formed on the second conductive pattern 130 and the first conductive pattern 150. The first power supply voltage line 290 can be formed on the second insulating interlayer 133. The first power supply voltage line 290 can provide a first power supply voltage ELVDD to each of the second conductive pattern 130 and the 150 via a the seventh contact hole and an eighth contact hole 370, respectively. As the second conductive pattern 130 is spaced apart from the first conductive pattern 150, the second conductive pattern 130 and the first conductive pattern 150 do not overlap the second gate electrode 110. Accordingly, the short between the second gate electrode 110 and the conductive patterns can be prevented.

FIGS. 11 through 14 are layout diagrams illustrating an OLED display including the pixel in accordance with some example embodiments.

An OLED display illustrated in FIGS. 11 through 14 can have a configuration substantially the same as or similar to that of an OLED display described with reference to FIGS. 2 through 8 except the shape of an active pattern 105 and the shape of a first conductive pattern. In FIGS. 11 through 14, detailed descriptions for elements, which are substantially the same as or similar to the elements described with reference to FIGS. 2 through 8, are omitted.

An active pattern 105 can be formed on the substrate. Compared to an active pattern illustrated in FIG. 2, a third region C of the active pattern 105 can be extended in a second direction farther. That is, a first conductive pattern 145 can be interposed between a second gate electrode 110 and a third gate electrode 115. In some embodiments, the first conductive pattern 145 does not overlap the second gate electrode 110 and the third gate electrode 115, and overlaps at least a portion the third region C and at least a portion a fourth region D. A first portion 570 can be a portion where the first conductive pattern 145 overlaps the at least a portion the third region C, and a second portion 550 can be a portion where the first conductive pattern 145 overlaps the at least a portion the fourth region D.

A first connection pattern 430 can partially overlap the seventh region G and a portion of the first conductive pattern 145 on the second insulating interlayer. For example, a second contact hole 450 is located on the portion of the first conductive pattern 145, and a third contact hole 470 of the first connection pattern 430 can be located on the seventh region G. The first connection pattern 430 can be in contact with a portion of the first conductive pattern 145 and the seventh region G via the second contact hole 450 and the third contact hole 470. The portion of the first conductive pattern 145 and the seventh region G can be electrically connected via the first connection pattern 430. In example embodiments, the first conductive pattern 145 receives an initialization voltage VINT. As a result, the first conductive pattern 145 can provide the initialization voltage VINT to the seventh region G via the first connection pattern 430.

A first power supply voltage line 290 can extend in the second direction on the second insulating interlayer. The first power supply voltage line 290 can be in contact with the tenth region J of the active pattern 105 via a sixth contact hole 355, can be in contact with a second conductive pattern 130 via a seventh contact hole 360. That is, the first power supply voltage line 290 can be electrically connected to each of the tenth region J and the second conductive pattern 130 via the sixth contact hole 355 and the seventh contact hole 360, respectively. The first power supply voltage line 290 can provide the first power supply voltage ELVDD to the tenth region J and the second conductive pattern 130.

The first conductive pattern 145 can form or define first and second parasitic capacitors CP1 and CP2 together with at least a portion of the third and fourth regions C and D. That is, the first conductive pattern 145 can be interposed between the data line 190 and the third and fourth regions C and D of the active pattern 105 such that the first conductive pattern 145 shields a parasitic capacitor between the data line 190 and the third and fourth regions C and D of the active pattern 100. As the first conductive pattern 145 receiving the first power supply voltage ELVDD has a voltage level that does not change even though a voltage level of the data signal DATA is changed, the crosstalk can be reduced. Accordingly, in some embodiments, the stain is not displayed in the OLED display and a definition of the OLED display can be improved. In addition, as the second conductive pattern 130 is spaced apart from the first conductive pattern 145, the second conductive pattern 130 and the first conductive pattern 145 do not overlap the second gate electrode 110. Accordingly, the short between the second gate electrode 110 and the conductive patterns can be prevented.

The described technology can be applied to various display devices including an OLED display. For example, the described technology is applied to mobile phones, smartphones, smart pads, laptop computers, tablet computers, personal digital assistants (PDAs), portable multimedia players (PMPs), digital cameras, music players (e.g., MP3 players), portable game consoles, navigation systems, portable communication devices, and display device for vehicles, ships, and aircrafts. The described technology can be applied in display devices for display or for information transfer, displays for medical devices, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A pixel, comprising:
   an organic light-emitting diode (OLED) configured to emit light based on a driving current, the OLED including an anode and a cathode on a substrate;
   a first transistor configured to generate the driving current, the first transistor including a first terminal to which a first power supply voltage is applied, a second terminal electrically connected to the anode, and a gate terminal to which a second power supply voltage is applied;
   a first parasitic capacitor connected between a first power supply voltage line to which the first power supply voltage is applied and a first node;
   a second transistor including a first terminal connected to a second node that connects the gate terminal of the first transistor, a second terminal connected to the first node, and a gate terminal to which a scan signal is applied;
   a third transistor including a first terminal connected to the first node, a second terminal connected to the second terminal of the first transistor, and a gate terminal to which the scan signal is applied, the first node being connected to the gate terminal of the first transistor through the second transistor without passing through the second node;
   a fourth transistor including a first terminal to which a data signal is applied, a second terminal connected to the first terminal of the first transistor, and a gate terminal to which the scan signal is applied;
   a storage capacitor connected between the first power supply voltage line and the second node; and
   fifth and sixth transistors that are connected between the second node and a second power supply voltage line to which the second power supply voltage is applied, wherein the fifth transistor includes a first terminal connected to the second node, a second terminal connected to the sixth transistor, and a gate terminal to which a data initialization signal is applied, and wherein the sixth transistor includes a first terminal connected to the second terminal of the fifth transistor, a second terminal connected to the second power supply voltage line, and a gate terminal to which the data initialization signal is applied.

2. The pixel of claim 1, wherein the anode receives the first power supply voltage, and the cathode receives a third power supply voltage, and
   wherein a voltage level of the first power supply voltage is greater than a voltage level of the third power supply voltage.

3. The pixel of claim 1, wherein the second transistor and the third transistor are connected in series, and the scan signal is commonly applied to the second and third transistors.

4. The pixel of claim 1, wherein the second and third transistors connect the gate and second terminals of the first transistor while the scan signal is activated.

5. The pixel of claim 1, wherein the fourth transistor provides the data signal to the first terminal of the first transistor while the scan signal is activated.

6. The pixel of claim 1, wherein the storage capacitor provides the driving current generated from the first transistor to the OLED while the scan signal is inactivated.

7. The pixel of claim 1, wherein the fifth transistor and the sixth transistor are connected in series, and the data signal is commonly applied to the fifth and sixth transistors.

8. The pixel of claim 1, wherein the fifth and sixth transistors provide the second power supply voltage to the gate terminal of the first transistor while the data initialization signal is activated.

9. The pixel of claim 1, further comprising:
   a seventh transistor including a first terminal connected to the second terminal of the sixth transistor, a second terminal connected to the anode of the OLED, and a gate terminal to which the data initialization signal is applied, wherein the seventh transistor provides the second power supply voltage to the anode of the OLED while the data initialization signal is activated.

10. The pixel of claim 9, further comprising:
an eighth transistor including a first terminal connected to the second terminal of the first transistor, a second terminal connected to the second terminal of the seventh transistor, and a gate terminal to which an emission signal is applied; and
a ninth transistor including a first terminal connected to the first power supply voltage line, a second terminal connected to the first terminal of the first transistor, and a gate terminal to which the emission signal is applied.

11. The pixel of claim 10, wherein the first transistor is connected between the eighth and ninth transistors, and the emission signal is commonly applied to the eighth and ninth transistors.

12. The pixel of claim 10, wherein the eighth transistor provides the driving current generated from the first transistor to the OLED while the emission signal is activated, and
wherein the ninth transistor provides the first power supply voltage to the first terminal of the first transistor while the emission signal is activated.

13. The pixel of claim 1, further comprising:
a second parasitic capacitor connected between the first power supply voltage and the second node.

14. The pixel of claim 13, further comprising:
an active pattern formed over the substrate and including a first region, a second region, a third region, and a fourth region;
a gate insulation layer formed over the active pattern and the substrate;
a first gate electrode formed over the gate insulation layer and partially overlapping the active pattern, wherein the first gate electrode, the first region and the second region define the first transistor;
a second gate electrode formed on the same layer as the first gate electrode, wherein the second gate electrode, the third region and the fourth region define the second transistor, and wherein the second gate electrode, the second region and the fourth region define the third transistor;
a first insulating interlayer formed over the first gate electrode, the second gate electrode, and the gate insulation layer; and
a conductive pattern formed over the first insulating interlayer and overlapping at least a portion of the third and fourth regions, wherein the conductive pattern and the overlapping portions of the third and fourth regions define a parasitic capacitor.

15. The pixel of claim 14, wherein the first power supply voltage line to which the first power supply voltage is applied is formed on the conductive pattern, and the OLED is formed on the first power supply voltage line, wherein the OLED is electrically connected to the first, second, and third transistors.

16. The pixel of claim 15, wherein the fourth region corresponds to the first node, and the third region corresponds to the second node, and wherein the first parasitic capacitor corresponds a portion where the fourth region and the conductive pattern are overlapped, and the second parasitic capacitor corresponds a portion where the third region and the conductive pattern are overlapped.

17. The pixel of claim 16, wherein the second gate electrode includes:

a second gate extended portion extending in a first direction that is parallel to an upper surface of the substrate; and
a second gate protruding portion protruding from the second gate extended portion in a second direction crossing the first direction,
wherein the second gate extended portion includes a first portion formed on a first side of the second gate extended portion, wherein the first portion of the second gate extended portion corresponds to the gate terminal of the third transistor, and wherein the second gate protruding portion corresponds to the gate terminal of the second transistor.

18. The pixel of claim 17, wherein the active pattern further includes a fifth region, wherein the second gate electrode, the first region and the fifth region define the fourth transistor, wherein the second gate extended portion includes a second portion formed on a second side opposing the first side of the second gate extended portion, and wherein the second portion of the second gate extended portion corresponds to the gate terminal of the fourth transistor.

19. The pixel of claim 18, further comprising:
a data line formed on the same layer as the first power supply voltage line,
wherein the data line is configured to receive the data signal and provide the data signal to the fifth region, and
wherein the conductive pattern is interposed between the data line and the third and fourth regions of the active pattern such that the parasitic capacitor is electrically disconnected from the data line.

20. An organic light emitting diode display, comprising:
an organic light emitting diode;
a first power supply voltage;
a first transistor electrically connected to the organic light-emitting diode and the first power supply voltage;
a second transistor electrically connected to the first transistor by a semiconductor string;
a conductive pattern electrically connected to the first power supply voltage; and
a storage capacitor electrically connected to the first transistor,
wherein the conductive pattern overlaps a portion of the semiconductor string between the first transistor and the second transistor.

21. The organic light emitting diode display of claim 20, further comprising:
a data line; and
a third transistor electrically connected to the date line.

22. The organic light emitting diode display of claim 21, wherein the conductive pattern overlaps the data line.

23. The organic light emitting diode display of claim 22, further comprising:
a second organic light emitting diode;
a fifth transistor electrically connected to the second organic light emitting diode and the first power supply voltage; and
a sixth transistor electrically connected to the fifth transistor by a second semiconductor string,
wherein the conductive pattern overlaps a portion of the second semiconductor string between the fifth transistor and the sixth transistor.

24. The organic light emitting diode display of claim 20, further comprising: an insulating interlayer between the conductive pattern and the semiconductor string.

25. The organic light emitting diode display of claim 24, further comprising:
a second insulating interlayer between the conductive pattern and the first power supply voltage,
wherein the conductive pattern is connected to the first power supply voltage through a contact hole in the second insulating interlayer.

26. The organic light emitting diode display of the claim 25, further comprising:
a second power supply voltage electrically connected to the second transistor.

27. The organic light emitting diode display of claim 26, further comprising:
a data line; and
a third transistor electrically connected to the data line.

28. The organic light emitting diode display of claim 27, wherein the conductive pattern overlaps the data line.

29. The organic light emitting diode display of claim 28, further comprising:
a second organic light emitting diode;
a fifth transistor electrically connected to the second organic light emitting diode and the first power supply voltage; and
a sixth transistor electrically connected to the fifth transistor by a second semiconductor string,
wherein the conductive pattern overlaps a portion of the second semiconductor string between the fifth transistor and the sixth transistor.

30. An organic light emitting diode display, comprising:
an organic light emitting diode;
a first power supply voltage;
a first transistor electrically connected to the organic light emitting diode and the first power supply voltage;
a second transistor electrically connected to the first transistor;
a third transistor electrically connected to the second transistor, wherein the first transistor, the second transistor, and the third transistor are connected by a semiconductor string;
a first parasitic capacitor electrically connected to the first power supply voltage; and
a storage capacitor electrically connected to the first transistor, wherein the first parasitic capacitor is formed between the first power supply voltage and a first node between the first transistor and the second transistor.

31. The organic light emitting diode display of claim 30, further comprising:
a second parasitic capacitor electrically connected to the first power supply voltage, wherein the second parasitic capacitor is formed between the first power supply voltage and a second node between the second transistor and the third transistor.

32. The organic light emitting diode display of claim 30, further comprising:
a data line; and
a fourth transistor electrically connected to the data line.

33. The organic light emitting diode display claim 32, further comprising:
a conductive pattern electrically connected to the first power supply voltage, wherein the conductive pattern overlaps the data line.

34. The organic light emitting diode display of claim 33, further comprising:
a second parasitic capacitor electrically connected to the first power supply voltage,
wherein the second parasitic capacitor is formed between the first power supply voltage and a second node between the second transistor and the third transistor.

* * * * *